United States Patent
Kao et al.

(10) Patent No.: US 12,342,727 B2
(45) Date of Patent: Jun. 24, 2025

(54) MAGNETORESISTIVE RANDOM-ACCESS MEMORY (MRAM) STRUCTURE FOR IMPROVING PROCESS CONTROL AND METHOD OF FABRICATING THEREOF

(71) Applicant: Taiwan Semiconductor Manufacturing Company, Ltd., Hsin-Chu (TW)

(72) Inventors: Hsiang-Lun Kao, Taoyuan County (TW); Chen-Chiu Huang, Taichung (TW); Chien-Hua Huang, Miaoli County (TW); Chung-Te Lin, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 569 days.

(21) Appl. No.: 17/589,018

(22) Filed: Jan. 31, 2022

(65) Prior Publication Data
US 2023/0138005 A1 May 4, 2023

Related U.S. Application Data

(60) Provisional application No. 63/275,542, filed on Nov. 4, 2021.

(51) Int. Cl.
*H10N 50/01* (2023.01)
*H10B 61/00* (2023.01)
(Continued)

(52) U.S. Cl.
CPC ............. *H10N 50/01* (2023.02); *H10B 61/22* (2023.02); *H10N 50/80* (2023.02); *H10N 50/85* (2023.02)

(58) Field of Classification Search
CPC ........ H10N 50/01; H10N 50/80; H10N 50/85; H10N 50/10; H10B 61/22
(Continued)

(56) References Cited

U.S. PATENT DOCUMENTS

| | | | |
|---|---|---|---|
| 2012/0141882 A1* | 6/2012 | Ota | H01M 4/661 |
| | | | 429/304 |
| 2016/0156020 A1* | 6/2016 | Tokoro | H01M 10/0525 |
| | | | 252/182.1 |

(Continued)

*Primary Examiner* — Duy T Nguyen
(74) *Attorney, Agent, or Firm* — HAYNES AND BOONE, LLP

(57) ABSTRACT

An exemplary method includes forming a multilayer inter-level dielectric (ILD) layer having a metal-containing dielectric layer (e.g., an aluminum oxide layer) between a first dielectric layer and a second dielectric layer and forming a bottom electrode via in the multilayer ILD layer. The method further includes forming a bottom electrode layer over the bottom electrode via, magnetic tunnel junction (MTJ) layers over the bottom electrode layer, and a top electrode layer over the MTJ layers. The bottom electrode layer, the MTJ layers, and the top electrode layer are etched to form a bottom electrode, an MTJ element, and a top electrode, respectively, of a magnetoresistive random-access memory (MRAM). The etching, such as an ion beam etch, forms a recess in the multilayer ILD layer that extends to the metal-containing dielectric layer of the multilayer ILD layer. In some embodiments, the etching extends the recess into and/or through the metal-containing dielectric layer.

20 Claims, 19 Drawing Sheets

(51) Int. Cl.
  *H10N 50/80* (2023.01)
  *H10N 50/85* (2023.01)
(58) Field of Classification Search
  USPC .......................................................... 257/421
  See application file for complete search history.

(56) References Cited

U.S. PATENT DOCUMENTS

| | | | |
|---|---|---|---|
| 2017/0069835 A1* | 3/2017 | Sonoda | .................. H10N 50/01 |
| 2019/0348601 A1* | 11/2019 | Yang | ...................... H10N 50/10 |
| 2020/0006639 A1* | 1/2020 | Wu | ......................... H10N 50/10 |
| 2020/0083287 A1* | 3/2020 | Chou | ..................... H10N 50/10 |
| 2020/0135806 A1* | 4/2020 | Peng | ..................... G11C 11/005 |
| 2021/0041608 A1* | 2/2021 | Kimoto | ................ G02B 5/0891 |
| 2021/0391531 A1* | 12/2021 | Wu | ......................... H10N 50/01 |

* cited by examiner

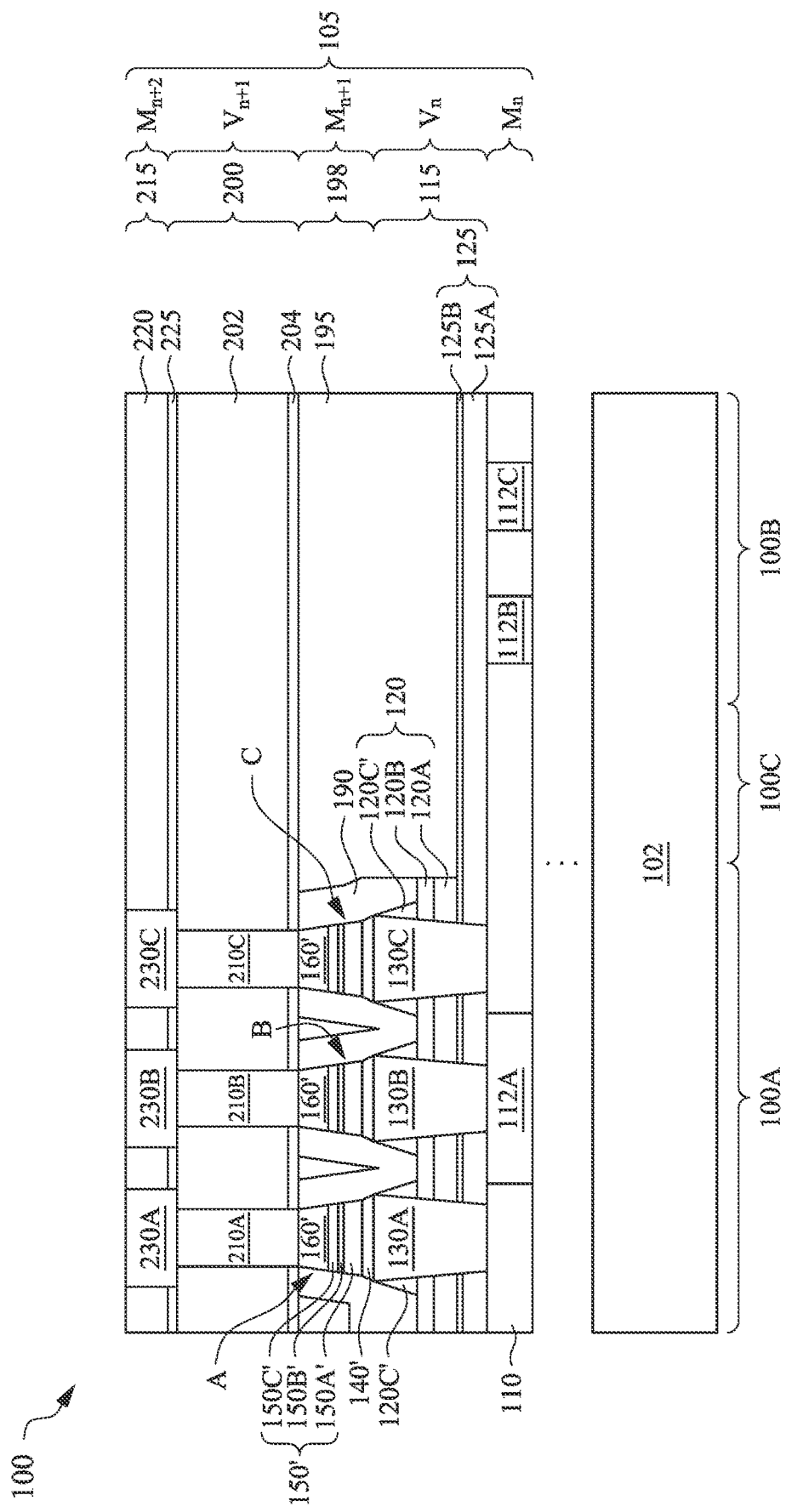

MAGNETORESISTIVE RANDOM-ACCESS MEMORY (MRAM) STRUCTURE FOR IMPROVING PROCESS CONTROL AND METHOD OF FABRICATING THEREOF

This is a non-provisional application of and claims benefit of U.S. Provisional Patent Application Ser. No. 63/275,542, filed Nov. 4, 2021, the entire disclosure of which is incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also increased the complexity of processing and manufacturing ICs.

Modern day electronic devices often contain electronic memory configured to store data, such as volatile memory and/or or non-volatile memory. Volatile memory stores data while powered (i.e., stores data when powered on), while non-volatile memory stores data even when not powered (i.e., stores data when powered on and/or powered off). Magnetoresistive random-access memory (MRAM) is one promising candidate for next generation non-volatile memory technology. For example, MRAM can offer comparable performance to volatile static random-access memory (SRAM) and be fabricated at comparable densities with lower power consumption than volatile dynamic random-access memory (DRAM). As another example, compared to non-volatile flash memory, MRAM can offer faster access times and degrade less over time. An MRAM cell typically includes a magnetic tunneling junction (MTJ), which is formed from two ferromagnetic layers separated by a thin insulating barrier layer, disposed between a top electrode and a bottom electrode, where the MTJ operates by tunneling electrons between the two ferromagnetic layers through the insulating barrier layer. As MRAM cells shrink to meet demands of scaled, advanced IC technology nodes, challenges have arisen with patterning various layers of the MRAM cell and improvements are needed.

BRIEF DESCRIPTION OF THE DRAWINGS

The present disclosure is best understood from the following detailed description when read with the accompanying figures. It is emphasized that, in accordance with standard practice in the industry, various features are not drawn to scale and are used for illustration purposes only. Dimensions of the various features may be arbitrarily increased or reduced for clarity of discussion.

FIGS. 2-5, FIGS. 6A-6D, FIGS. 7A-7D, and FIGS. 8A-8D are fragmentary diagrammatic cross-sectional views of a workpiece, in portion or entirety, at various fabrication stages associated with fabricating an MRAM, such as those associated with the method of FIG. 1, according to various aspects and embodiments of the present disclosure.

DETAILED DESCRIPTION

Figure 1:
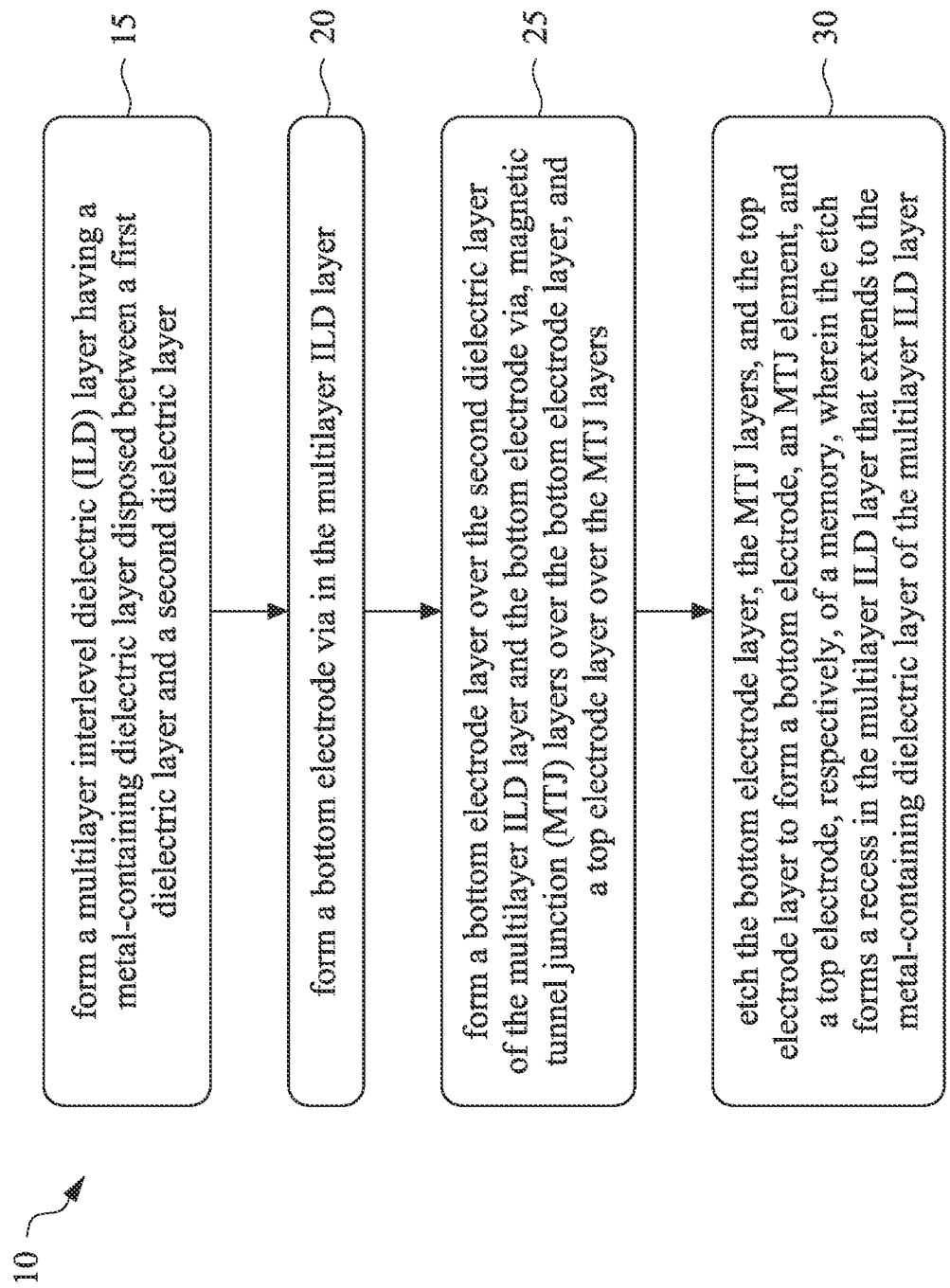
FIG. 1 is a flow chart of a method for fabricating a magnetoresistive random-access memory (MRAM), in portion or entirety, according to various aspects of the present disclosure.

The present disclosure relates generally to integrated circuit (IC) devices and/or semiconductor devices, and more particularly, to IC devices and/or semiconductor devices that include and/or are configured as memory devices and/or memory structures.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first feature and the second feature are formed in direct contact and may also include embodiments in which additional features may be formed between the first feature and the second feature, such that the first feature and the second feature may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Furthermore, when a number or a range of numbers is described with "about," "approximate," "substantially," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/−10% by one of ordinary skill in the art. In another example, two features described as having "substantially the same" dimension and/or "substantially" oriented in a particular direction and/or configuration (e.g., "substantially parallel") encompasses dimension differences between the two features and/or slight orientation variances of the two features from the exact specified orientation that may arise inherently, but not intentionally, from manufacturing tolerances associated with fabricating the two features. Still further, the present disclosure may repeat reference numerals and/or letters in the various examples. This repetition is for the purpose of simplicity and clarity and does not in itself dictate a relationship between the various embodiments and/or configurations described herein.

Embodiments of the present disclosure provide a multi-layer dielectric layer, such as a multilayer interlevel (or interlayer) dielectric (ILD) layer, that improves control of MRAM layer patterning, in particular, patterning of magnetic tunneling junction (MTJ) layers and bottom electrode layers to provide MTJ stacks and bottom electrodes, respectively, of MRAM structures. In some embodiments, the disclosed multilayer dielectric layer incorporates a metal-containing dielectric layer to provide etch selectivity to an ion beam etch (IBE) process used for patterning MTJ layers and bottom electrode layers. In some embodiments, the MTJ layers and the bottom electrode layers are patterned by IBE in a single etch step, where the IBE stops upon reaching, etching, and/or extending through the metal-containing dielectric layer. By providing the IBE with etch selectivity to the multilayer dielectric layer, etching back and/or recessing of the multilayer dielectric layer is better controlled in different regions of a device, such as a memory region having MRAM structures and a logic region, which may be less densely populated than the memory region at the level including MRAM structures. Improved control can minimize (and, in some embodiments, eliminate) damage to the logic region, such as over etching of a dielectric layer in the logic region and damaging of underlying metal layers in the logic region when fabricating the MRAM structures. In some embodiments, metal-containing dielectric material removed by the IBE redeposits along sidewalls of the MRAM structures, thereby forming metal-containing dielectric spacers along sidewalls of the MTJ stacks and/or bottom electrodes (and, in some embodiments, along sidewalls of top electrodes) of the MRAM structures. The metal-containing dielectric spacers can enhance insulation of the MRAM structures and prevent metal material removed from bottom electrode layers by the IBE from forming shunt paths along sidewalls of the MTJ stacks. MRAM structures and devices including such MRAM structures, described herein, exhibit improved reliability and performance compared to MRAM structures and devices including such MRAM structures that implement conventional fabrication techniques and conventional dielectric layers. Different embodiments may have different advantages, and no particular advantage is required of any embodiment.

Turning to FIG. 1, FIG. 1 is a flow chart of a method 10 for fabricating an MRAM, in portion or entirety, according to various aspects of the present disclosure. At block 15, method 10 includes forming a multilayer interlevel dielectric (ILD) layer having a metal-containing dielectric layer disposed between a first dielectric layer and a second dielectric layer. At block 20, method 10 includes forming a bottom electrode via in the multilayer ILD layer. At block 25, method 10 includes forming a bottom electrode layer over the second dielectric layer of the multilayer ILD layer and the bottom electrode via, magnetic tunnel junction (MTJ) layers over the bottom electrode layer, and a top electrode layer over the MTJ layers. At block 30, method 10 includes etching the bottom electrode layer, the MTJ layers, and the top electrode layer to form a bottom electrode, an MTJ element, and a top electrode, respectively, of a memory. The etching forms a recess in the multilayer ILD layer that extends to the metal-containing dielectric layer of the multilayer ILD layer. FIG. 1 has been simplified for the sake of clarity to better understand the inventive concepts of the present disclosure. Additional steps can be provided before, during, and after method 10, and some of the steps described can be moved, replaced, or eliminated for additional embodiments of method 10.

Figure 9:
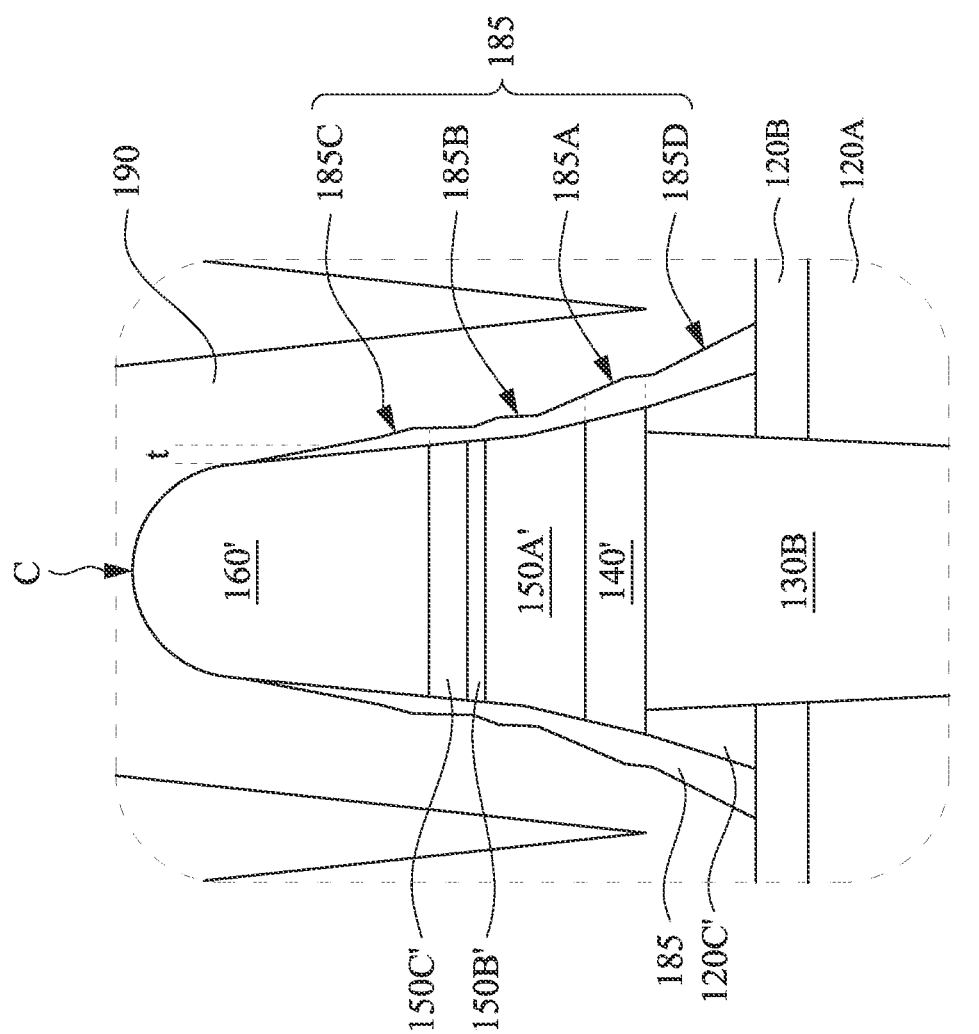
FIG. 9 is an enlarged fragmentary diagrammatic cross-sectional view of a memory cell, in portion or entirety, of the MRAM after processing associated with FIG. 6A according to various aspects and embodiments of the present disclosure.

FIGS. 2-5, FIGS. 6A-6D, FIGS. 7A-7D, and FIGS. 8A-8D are fragmentary diagrammatic cross-sectional views of a workpiece 100, in portion or entirety, at various fabrication stages associated with fabricating an MRAM (such as those in method 10 of FIG. 1) according to various aspects of the present disclosure. FIG. 9 is an enlarged fragmentary diagrammatic cross-sectional view of a memory cell, in portion or entirety, of the MRAM after processing associated with FIGS. 6A-6D according to various aspects of the present disclosure. Workpiece 100 has a memory region 100A, a logic region 100B (i.e., core region), and an intermediate region 100C between and separating memory region 100A and logic region 100B. As described herein, workpiece 100 is fabricated to provide memory region 100A with memory cells, such as MRAM cells, each of which can provide a storage device and/or a storage function. In some embodiments, memory region 100A is also configured with flash memory cells, other non-volatile random-access memory (NVRAM) cells, static random-access memory (SRAM) cells, dynamic random-access memory (DRAM) cells, other volatile memory cells, and/or other suitable memory cells. Workpiece 100 can also be fabricated to provide logic region 100B with standard cells, each of which can provide a logic device and/or a logic function, such as an inverter, an AND gate, an NAND gate, an OR gate, an NOR gate, a NOT gate, an XOR gate, an XNOR gate, and/or other suitable logic devices. In some embodiments, memory cells and/or logic cells include transistors and interconnect structures that combine to provide desired storage devices/functions and logic devices/functions, respectively. Workpiece 100 can further have an analog region, a peripheral region (e.g., an input/output (I/O) region), a dummy region, and/or other suitable region. FIGS. 2-5, FIGS. 6A-6D, FIGS. 7A-7D, FIGS. 8A-8D, and FIG. 9 have been simplified for the sake of clarity to better understand the inventive concepts of the present disclosure. Additional features can be added in workpiece 100 and/or the MRAM fabricated thereon, and some of the features described below can be replaced, modified, or eliminated in other embodiments of workpiece 100 and/or the MRAM fabricated thereon.

Figure 2:
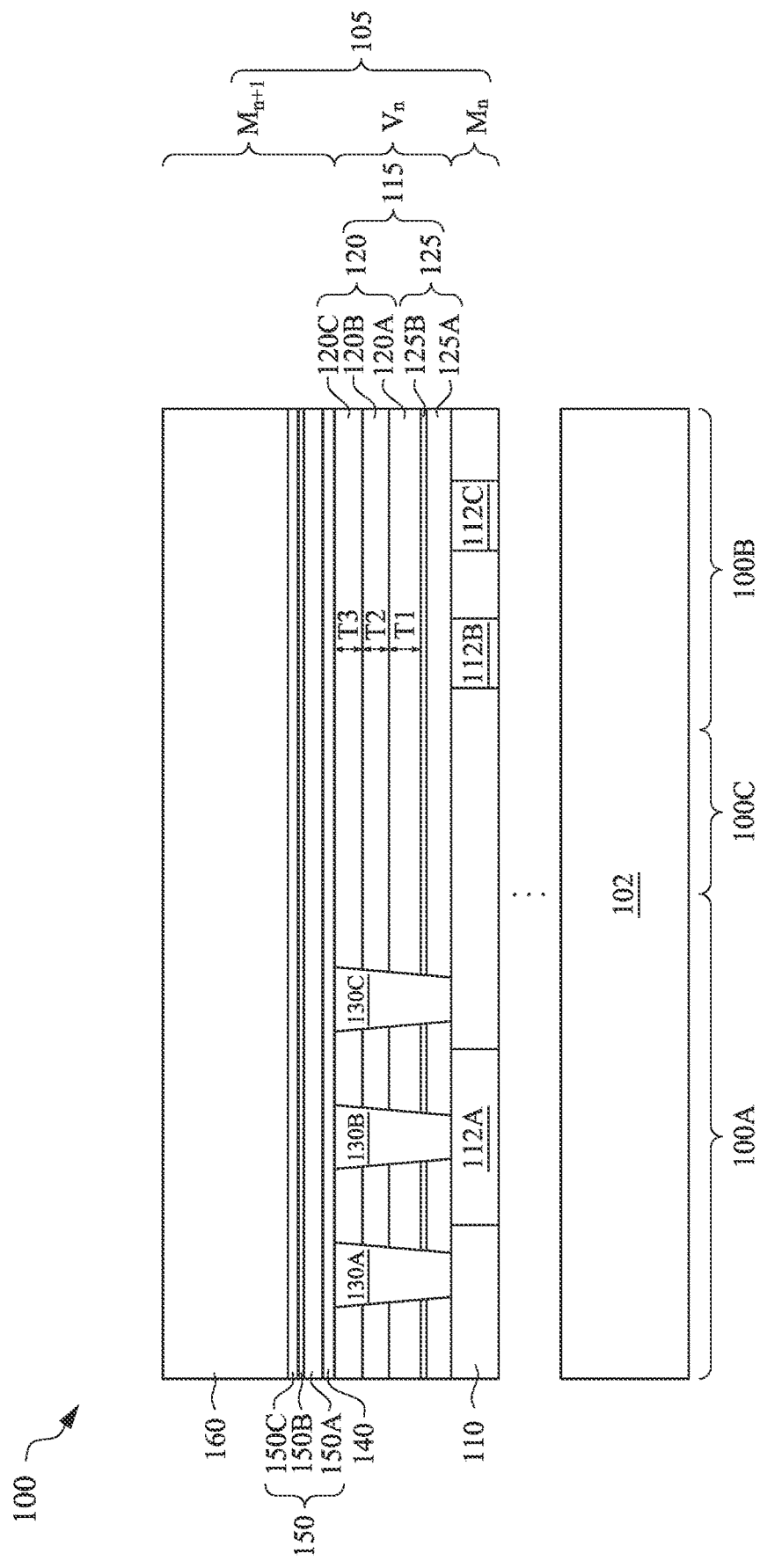

Turning to FIG. 2, workpiece 100 is received for processing, where workpiece 100 includes a device substrate 102, where a multi-layer interconnect (MLI) feature 105 is disposed over device substrate 102. Memory region 100A, logic region 100B, and intermediate region 100C share device substrate 102 and MLI feature 105. Device substrate 102 can include various device components/features, such as a semiconductor substrate, doped wells (e.g., n-wells and/or p-wells), isolation features (e.g., shallow trench isolation (STI) structures and/or other suitable isolation structures), metal gates (for example, a metal gate having a gate electrode over a gate dielectric), gate spacers along sidewalls of the metal gates, source/drain features (e.g., epitaxial source/drain features), and/or other suitable device components. In some embodiments, device substrate 102 includes a planar transistor, where a channel of the planar transistor is formed in the semiconductor substrate between respective source/drains and a respective metal gate is disposed on the channel (e.g., on a portion of the semiconductor substrate in which the channel is formed). In some embodiments, device substrate 102 includes a non-planar transistor having a channel formed in a semiconductor fin that extends from the semiconductor substrate and between respective source/drains on/in the semiconductor fin, where a respective metal gate is disposed on and wraps the channel of the semiconductor fin (i.e., the non-planar transistor is a fin-like field effect transistor (FinFET)). In some embodiments, device substrate 102 includes a non-planar transistor having channels formed in semiconductor layers suspended over the semiconductor substrate and extending between respective source/drains, where a respective metal gate is disposed on and surrounds the channels (i.e., the non-planar transistor is a gate-all-around (GAA) transistor). Device substrate 102 can include various passive microelectronic devices and active microelectronic devices, such as resistors, capacitors, inductors, diodes, p-type FETs (PFETs), n-type FETs (NFETs), metal-oxide semiconductor (MOS) FETs (MOSFETs), complementary MOS (CMOS) transistors, bipolar junction transistors (BJTs), laterally diffused MOS (LDMOS) transistors, high voltage transistors, high frequency transistors, other suitable components, or combinations thereof. The various microelectronic devices can be configured to provide functionally distinct regions, such as memory region 100A and logic region 100B of workpiece 100. The various transistors can be configured as planar transistors or non-planar transistors depending on design requirements of workpiece 100.

MLI feature 105 electrically couples various devices and/or components of device substrate 102 and/or various devices and/or components of MLI feature 105 (e.g., a memory device, such as an MRAM, disposed within MLI feature 105), such that the various devices and/or components can operate as specified by design requirements. MLI feature 105 includes a combination of dielectric layers and electrically conductive layers (e.g., metal layers) configured to form various interconnect (routing) structures. The conductive layers are configured to form vertical interconnect features, such as device-level contacts and/or vias, and/or horizontal interconnect features, such as conductive lines. Vertical interconnect features typically connect horizontal interconnect features in different layers/levels (or different planes) of MLI feature 105. During operation, the interconnect structures can route signals between devices and/or components of device substrate 102 and/or MLI feature 105 and/or distribute signals (for example, clock signals, voltage signals, and/or ground signals) to the devices and/or the device components of device substrate 102 and/or MLI feature 105. Though MLI feature 105 is depicted with a given number of dielectric layers and metal layers, the present disclosure contemplates MLI feature 105 having more or less dielectric layers and/or metal layers.

In FIG. 2, a portion of MLI feature 105 is illustrated that includes an nth metallization layer (denoted as $M_n$ metal layer (or level)), an nth via layer (denoted as $V_n$ via layer (or level)) over nth metallization layer, and an (n+1)th metallization layer (denoted as $M_{n+1}$ metal layer (or level)) over nth via layer, where n is an integer greater than or equal to 1. In the depicted embodiment, n is greater than 1 (e.g., n=3, 4, 5, or 6), where MLI feature 105 includes metallization layers (e.g., (n−1)th metallization layer and so on) and via layers (e.g., (v−1)th via layer and so on) between $M_n$ metal layer and device substrate 102. In some embodiments, n equals 4, such that $M_n$ metal layer is a fourth metal layer (i.e., M4 level), $V_n$ via layer is a fourth via layer (i.e., V4 level), and $M_{+1}$ metal layer is a fifth metal layer (i.e., M5 level) of MLI feature 105. In some embodiments, MLI feature 105 includes metallization layers (e.g., (n+2)th metallization layer and so on) and via layers (e.g., (v+2)th via layer and so on) above $M_{+1}$ metal layer. In furtherance of the depicted embodiment, $V_n$ via layer is directly above, physically connected, and electrically connected to $M_n$ metal layer and $M_{n+1}$ metal layer is directly above, physically connected, and electrically connected to $V_n$ via layer. In such embodiments, $V_n$ via layer physically and electrically connects $M_n$ metal layer and $M_{n+1}$ metal layer. $M_n$ metal layer, $V_n$ via layer, and $M_{n+1}$ metal layer are also electrically connected to device substrate 102.

$M_n$ metal layer includes a dielectric layer 110 having $M_n$ metal lines disposed therein, such as a metal line 112A, a metal line 112B, and a metal line 112C. Dielectric layer 110 includes an interlevel dielectric (ILD) layer of MLI feature 105, where the ILD layer includes a dielectric material, such as silicon oxide, tetraethylorthosilicate (TEOS) oxide, phosphosilicate glass (PSG), boron-doped silicate glass (BSG), boron-doped PSG (BPSG), low-k dielectric material, other suitable dielectric material, or combinations thereof. Exemplary low-k dielectric materials include fluorosilicate glass (FSG), carbon-doped oxide, Black Diamond® (Applied Materials of Santa Clara, California), Xerogel, Aerogel, amorphous fluorinated carbon, Parylene, BCB, SiLK (Dow Chemical, Midland, Michigan), polyimide, other low-k dielectric material, or combinations thereof. In some embodiments, the ILD layer includes a low-k dielectric material, such as a carbon-doped oxide, or an extreme low-k dielectric material, such as a porous carbon-doped oxide. In some embodiments, dielectric layer 110 further includes a contact etch stop layer (CESL) disposed between the ILD layer and device substrate 102. The CESL includes a material different than the ILD layer, such as a dielectric material that is different than the dielectric material of the ILD layer. For example, where the ILD layer includes a low-k dielectric material (having, for example, a dielectric constant that is less than a dielectric constant of silicon oxide (e.g., k<3.9)), the CESL can include silicon and nitrogen, such as silicon nitride, silicon oxynitride, and/or silicon carbonitride. The ILD layer and/or the CESL may have a multilayer structure having multiple dielectric materials depending on design requirements. The ILD layer and/or the CESL of dielectric layer 110 are deposited over workpiece 100 by chemical vapor deposition (CVD), plasma enhanced CVD (PECVD), high density plasma CVD (HDPCVD), flowable CVD (FCVD), physical vapor deposition (PVD), atomic layer deposition (ALD), metalorganic chemical vapor deposition (MOCVD), remote plasma CVD (RPCVD), low-pressure CVD (LPCVD), atomic layer CVD (ALCVD), atmospheric pressure CVD (APCVD), other suitable deposition methods, or combinations thereof.

Metal lines 112A-112C include a metal material, including for example, aluminum, copper, titanium, tantalum, tungsten, ruthenium, cobalt, iridium, palladium, platinum, nickel, alloys thereof, silicides thereof, other suitable metals, or combinations thereof. In the depicted embodiment, metal line 112A is formed in memory region 100A and metal line 112B and metal line 112C are formed in logic region 100B. In some embodiments, metal lines 112A-112C are electrically connected to device substrate 102 by MLI feature 105, such as by underlying metallization layers and/or underlying via layers. In some embodiments, metal lines 112A-112C are formed by performing a lithography and etching process to form openings in dielectric layer 110 that expose one or more conductive features in an underlying layer, filling the openings with a conductive material, and performing a planarization process that removes excess conductive material, such that metal lines 112A-112C and dielectric layer 110 form a substantially planar, common surface. The conductive material is formed by a deposition process (for example, PVD, CVD, ALD, and/or other suitable deposition process) and/or an annealing process. In some embodiments, metal lines 112A-112C include a bulk metal layer (also referred to as a metal plug). In some embodiments, metal lines 112A-112C include a barrier layer, an adhesion layer, and/or other suitable layer disposed between the bulk metal layer and dielectric layer 110. In some embodiments, the barrier layer, the adhesion layer, and/or other suitable layer include titanium, titanium alloy (e.g., TiN), tantalum, tantalum alloy (e.g., TaN), other suitable constituent, or combinations thereof. Other fabrication processes are possible for forming dielectric layer 110 and/or metal lines 112A-112C within dielectric layer 110.

$V_n$ via layer includes a dielectric layer 115 having a multilayer structure, such as an ILD layer 120 disposed over a CESL 125. As described herein, ILD layer 120 has a multilayer structure that improves process control during formation of an MRAM cell over and/or in ILD layer 120 and improves performance and/or reliability of the MRAM cell. In FIG. 2, ILD layer 120 includes a dielectric layer 120A having a thickness T1 over CESL 125, a dielectric layer 120B having a thickness T2 over dielectric layer 120A, and a dielectric layer 120C having a thickness T3 over dielectric layer 120B. Dielectric layer 120B is between and separates dielectric layer 120A and dielectric layer 120C. In the depicted embodiment, thickness T2 is less than thickness T1 and thickness T3, such that dielectric layer 120B is thinner than each of dielectric layer 120A and dielectric layer 120C. Thickness T2 is at least 5 nm to provide adequate process control during an etching process, such as an ion beam etching (IBE) process, implemented to form the MRAM cell of workpiece 100 over and/or in ILD layer 120 as described further below. In some embodiments, thickness T2 is greater than thickness T1 and/or thickness T3. In some embodiments, a total thickness of ILD layer 120 (i.e., a sum of thickness T1, thickness T2, and thickness T3) is about 25 nm to about 100 nm. In some embodiments, thickness T1 is about 10 nm to about 40 nm, thickness T2 is about 5 nm to about 20 nm, and/or thickness T3 is about 15 nm to about 40 nm. Dielectric layer 120A, dielectric layer 120B, and dielectric layer 120C can be referred to as sub-layers of ILD layer 120.

A composition of dielectric layer 120B is selected with respect to a composition of dielectric layer 120C to provide dielectric layer 120B and dielectric layer 120C with distinct etching sensitivities to a given etchant of a subsequent etching process and/or to a given subsequent etching process, such as an IBE process. For example, dielectric layer 120B includes a dielectric material having an etch rate to an IBE process that is less than an etch rate to the IBE process of a dielectric material of dielectric layer 120C, such that dielectric layer 120B can act as an etch stop layer during an IBE process implemented to pattern magnetic tunnel junction (MTJ) layers and/or a bottom electrode layer during fabrication of an MRAM cell, as described further below. Etch rate (also referred to as etch speed) generally indicates a depth an etch achieves in a given time period and/or an amount of a material removed by the etch in a given time. In the depicted embodiment, an etch rate of dielectric layer 120B is at least two times less than an etch rate of dielectric layer 120C to an IBE process. In such embodiments, an etch rate ratio (i.e., etch selectivity) of an etch rate of dielectric layer 120B to an etch rate of dielectric layer 120C to an IBE process is about 1:2 to about 1:4, thereby providing the IBE process with high selectivity between dielectric layer 120B and dielectric layer 120C. In some embodiments, to optimize selectivity between dielectric layer 120B and dielectric layer 120C and between dielectric layer 120B and the MTJ layers and/or the bottom electrode layer patterned by the IBE process, the etch rate ratio is 1:3. In some embodiments, the material of dielectric layer 120B also has an etch rate to the IBE process that is less than an etch rate to the IBE process of a material of dielectric layer 120A. As further described below, the dielectric material of dielectric layer 120B is further selected based on its ability to improve insulation and/or isolation between adjacent MRAM cells and/or between an MRAM cell and/or other adjacent devices.

In the depicted embodiment, high etch selectivity and improved insulation is provided when dielectric layer 120B includes metal and oxygen and dielectric layer 120C includes silicon and oxygen. In such embodiments, dielectric layer 120B can be referred to as a metal-containing dielectric layer, a metal-and-oxygen-comprising dielectric layer, and/or a metal oxide layer, and dielectric layer 120C can be referred to as a silicon-containing dielectric layer, a silicon-and-oxygen-comprising dielectric layer, and/or a silicon oxide layer. Compositions of the metal-containing dielectric layer and the silicon-containing dielectric layer are selected to provide an etch rate ratio to an IBE process of the metal-containing dielectric layer to the silicon-containing dielectric layer that is about 1:2 to about 1:4 (e.g., about 1:3). For example, the metal includes aluminum, hafnium, zirconium, scandium, copper, manganese, vanadium, other suitable metal, or combinations thereof. In the depicted embodiment, the metal is aluminum, and dielectric layer 120B is an aluminum oxide layer, such as an $Al_xO_y$ layer, where x is a number of aluminum atoms and y is a number of oxygen atoms. For example, dielectric layer 120B is an AlO layer, an AlSiO layer, and/or $Al_2O_3$ layer. In some embodiments, the metal is hafnium, and dielectric layer 120B is a hafnium oxide layer, such as an $Hf_xO_y$ layer, where x is a number of hafnium atoms and y is a number of oxygen atoms. In some embodiments, the metal is zirconium, and dielectric layer 120B is a zirconium oxide layer, such as a $Zr_xO_y$ layer, where x is a number of zirconium atoms and y is a number of oxygen atoms. In some embodiments, the metal is scandium, and dielectric layer 120B is a scandium oxide layer, such as an $Sc_xO_y$ layer, where x is a number of scandium atoms and y is a number of oxygen atoms. In some embodiments, dielectric layer 120B includes AlO, AlSiO, $Al_2O_3$, $HfO_2$, HfSiO, $HfSiO_4$, HfSiON, HfLaO, HfTaO, HfTiO, HfZrO, $HfAlO_z$, ZrO, $ZrO_2$, $ZrSiO_2$, TiO, $TiO_2$, LaO, LaSiO, $Ta_2O_3$, $Ta_2O_5$, $Y_2O_3$, $SrTiO_3$, BaZrO, $BaTiO_3$, (Ba,Sr)$TiO_3$, $HfO_2$-$Al_2O_3$, other suitable metal-containing dielectric layer and/or insulating material, or combinations thereof.

In some embodiments, dielectric layer 120C includes TEOS oxide, undoped silicate glass (USG), doped silicon oxide (also referred to as doped silicate glass) (e.g., BSG, PSG, BPSG, and/or FSG), and/or other suitable silicon-containing dielectric material. In the depicted embodiment, dielectric layer 120C is a silicate glass layer, such as a USG layer. A composition of dielectric layer 120A can be the same or different as dielectric layer 120C depending on design and/or fabrication requirements. For example, dielectric layer 120A includes silicon and oxygen, where a composition of the silicon oxide material of dielectric layer 120A can be the same or different than the composition of the silicon oxide material of dielectric layer 120C. In the depicted embodiment, dielectric layer 120A includes TEOS oxide, USG, BSG, PSG, BPSG, FSG, and/or other suitable silicon-containing dielectric material. For example, dielectric layer 120A is a silicate glass layer, such as a USG layer. ILD layer 120 (including dielectric layer 120A, dielectric layer 120B, and dielectric layer 120C) are deposited over workpiece 100 by CVD, PECVD, HDPCVD, FCVD, PVD, ALD, MOCVD, RPCVD, LPCVD, ALCVD, APCVD, other suitable deposition methods, or combinations thereof.

CESL 125 also has a multilayer structure, such as a CESL 125A and a CESL 125B. CESL 125A is over dielectric layer 110 (and metal lines 112A-112C disposed therein) and CESL 125B is over CESL 125A. A thickness of CESL 125A is greater than a thickness of CESL 125B, though the present disclosure contemplates embodiments where the thickness of CESL 125A is less than CESL 125B. In some embodiments, the thickness of CESL 125A is about 10 nm to about 20 nm, and the thickness of CESL 125B is about 2 nm to about 6 nm. CESL 125A and CESL 125B include dielectric materials and have different compositions (e.g., different dielectric materials or the same dielectric materials with different constituent concentrations, such as different oxygen atomic percentages). CESL 125A has a different composition than dielectric layer 110 (in particular, a portion of dielectric layer 110 that CESL 125A physically contacts), and CESL 125B has a different composition than ILD layer 120 (in particular, dielectric layer 120A). In some embodiments, CESL 125A includes silicon nitride (SiN), silicon oxynitride (SiON), silicon carbide (SiC), silicon carbonitride (SiCN), silicon oxycarbonitride (SiOCN), other dielectric material including silicon, oxygen, carbon, and/or nitrogen, or combinations thereof. In some embodiments, CESL 125B is a metal oxide layer, such as an aluminum oxide layer, a zirconium oxide layer, or a hafnium oxide layer. In some embodiments, CESL 125B is eliminated from CESL 125, such that CESL 125A physically contacts dielectric layer 110 and dielectric layer 120. Though CESL 125A and CESL 125B are depicted as single layers, the present disclosure contemplates embodiments where CESL 125A and/or CESL 125B include multiple layers. CESL 125A and/or CESL 125B are deposited over workpiece 100 by CVD, PECVD, HDPCVD, FCVD, PVD, ALD, MOCVD, RPCVD, LPCVD, ALCVD, APCVD, other suitable deposition methods, or combinations thereof.

$V_n$ via layer further includes $V_n$ vias disposed in dielectric layer 115, such as a bottom electrode via 130A, a bottom electrode via 130B, and a bottom electrode via 130C. Bottom electrode vias 130A-130C are formed in memory region 100A and extend through dielectric layer 115 (e.g., ILD layer 120 and CESL 125) to physically contact metal lines 112A-112D and/or dielectric layer 110 of $M_n$ metal layer. In the depicted embodiment, bottom electrode via 130B physically contacts metal line 112B. In some embodiments, bottom electrode via 130A and/or bottom electrode via 130C physically contact a metal line disposed in dielectric layer 110. Bottom electrode vias 130A-130C include a metal material, including for example, aluminum, copper, titanium, tantalum, tungsten, ruthenium, cobalt, iridium, palladium, platinum, nickel, alloys thereof, silicides thereof, other suitable metals, or combinations thereof. In some embodiments, bottom electrode vias 130A-130C include a bulk metal layer (also referred to as a metal plug) including, for example, tungsten and/or copper. In some embodiments, bottom electrode vias 130A-130C include a barrier layer, an adhesion layer, and/or other suitable layer disposed between the bulk metal layer and dielectric layer 115. In some embodiments, the barrier layer, the adhesion layer, and/or other suitable layer include titanium, titanium alloy (e.g., TiN), tantalum, tantalum alloy (e.g., TaN), other suitable constituent, or combinations thereof. In some embodiments, bottom electrode vias 130A-130C have a multi-layered structure. In some embodiments, bottom electrode vias 130A-130C are formed by performing a lithography and etching process to form openings in dielectric layer 115 that expose one or more of metal lines 112A-112C (here, metal line 112B), filling the openings with a conductive material, and performing a planarization process that removes excess conductive material, such that bottom electrode vias 130A-130C and dielectric layer 115 form a substantially planar, common surface. The conductive material is formed by a deposition process (for example, PVD, CVD, ALD, high-density ionized metal plasma (IMP) deposition, high-density inductively coupled plasma (ICP) deposition, sputtering, electroplating, electroless plating, and/or other suitable deposition process) and/or an annealing process. Other fabrication processes are possible for forming dielectric layer 115 and/or bottom electrode vias 130A-130C within dielectric layer 115. In some embodiments, such as depicted, bottom electrode vias 130A-130C are formed by a single damascene process (i.e., bottom electrode vias 130A-130C are formed separately from their corresponding underlying metal lines (e.g., metal lines 112A) and/or overlying metal lines (i.e., bottom electrodes of subsequently formed MRAM cells)).

An MRAM stack of material layers, which are a portion of $M_{n+1}$ metal layer, are formed over $V_n$ via layer. The MRAM stack of material layers are subsequently patterned, as described herein, to provide an MRAM having an MTJ structure (or element) disposed between a bottom electrode and a top electrode. In the depicted embodiment, the MRAM stack of material layers include a bottom electrode layer 140 over dielectric layer 115 (and bottom electrode vias 130A-130C disposed therein), an MTJ stack 150 over bottom electrode layer 140, and a top electrode layer 160 over MTJ layers 150. Bottom electrode layer 140 and top electrode layer 160 each include metal and can alternatively be referred to as metal layers. For example, bottom electrode layer 140 and/or top electrode layer 160 include titanium, tantalum, tungsten, ruthenium, platinum, iridium, gold, palladium, osmium, molybdenum, nickel, strontium, aluminum, other suitable metal, alloys thereof (e.g., TaN, TiN, and/or other suitable alloy), or combinations thereof. In the depicted embodiment, bottom electrode layer 140 is a TiN layer, and top electrode layer 160 is a TiN layer. In some embodiments, bottom electrode layer 140 and top electrode layer 160 have different compositions (e.g., different metal materials or the same metal materials with different constituent concentrations, such as different metal atomic percentages). In some embodiments, bottom electrode layer 140 and top electrode layer 160 have the same compositions (e.g., the same metal materials). In some embodiments, bottom electrode layer 140 and/or top electrode layer 160 has a multi-layer structure, such as a first electrode layer (e.g., a copper layer) disposed over a second electrode layer (e.g., a titanium layer), where the first electrode layer and the second electrode layer have different compositions. Bottom electrode layer 140 and/or top electrode layer 160 are deposited over workpiece 100 by PVD, CVD, ALD, IMP, ICP, sputtering, electroplating, electroless plating, and/or other suitable deposition process. In some embodiments, bottom electrode layer 140 and/or top electrode layer 160 are conformally deposited over workpiece 100. In some embodiments, bottom electrode layer 140 and/or top electrode layer 160 are blanket deposited over workpiece 100. In some embodiments, after deposition, a planarization process, such as chemical mechanical polishing (CMP), are performed on bottom electrode layer 140 and/or top electrode layer 160, providing bottom electrode layer 140 and/or top electrode layer 160 with substantially planar and/or flat top surfaces. In furtherance of the depicted embodiment, a thickness of bottom electrode layer 140 is less than a thickness of top electrode layer 160. In some embodiments, a thickness of bottom electrode layer 140 is about 1 nm to about 10 nm. In some embodiments, a thickness of top electrode layer 160 is about 10 nm to about 80 nm. In some embodiments, the thickness of bottom electrode layer 140 is the same or greater than a thickness of top electrode layer 160.

MTJ layers 150 are over bottom electrode layer 140. In FIG. 2, for ease of understanding, MTJ layers 150 are depicted with three layers—a ferromagnetic layer 150A over bottom electrode layer 140, a tunnel barrier layer 150B over ferromagnetic layer 150A, and a ferromagnetic layer 150C over tunnel barrier layer 150B (i.e., two ferromagnetic layers separated by a thin insulating layer). One of the ferromagnetic layers, such as ferromagnetic layer 150A, may be a magnetic layer that is pinned to an antiferromagnetic layer of MTJ layers 150, while the other one of the ferromagnetic layers, such as ferromagnetic layer 150C, is a "free" magnetic layer that can have its magnetic field changed to one of two or more values to store one of two or more corresponding data states. In such embodiments, ferromagnetic layer 150A can be referred to as a pinned layer and ferromagnetic layer 150C can be referred to as a free layer. In some embodiments, ferromagnetic layer 150A and/or ferromagnetic layer 150C include iron, cobalt, nickel, other suitable magnetic material constituent, alloys thereof, or combinations thereof, such as Fe, Co, Ni, FeCo, CoNi, CoFeB, FeB, FePt, FePd, CoFeTa, NiFe, CoFe, CoPt, CoPd, FePt, other alloys of Fe, Co, and/or Ni, and/or other suitable ferromagnetic materials. In some embodiments, tunnel barrier layer 150B includes metal (e.g., Mg, Al, Ti, Zn, Zr, and/or Hf) and oxygen. For example, tunnel barrier layer 150B includes magnesium oxide (e.g., Mg, MgZnO, and/or MgTaO), aluminum oxide (e.g., AlTiO and/or $Al_2O_3$), NiO, GdO, $Ta_2O_5$, $MoO_2$, $TiO_2$, $WO_2$, other suitable metal oxide materials, or combinations thereof. In some embodiments, MTJ layers 150 include an MgO layer (i.e., tunnel barrier layer 150B) sandwiched between two CoFeB layers (e.g., ferromagnetic layer 150A and ferromagnetic layer 150C). In some embodiments, a total thickness of MTJ layers 150 (i.e., a sum of a thickness of ferromagnetic layer 150A, tunnel barrier layer 150B, and ferromagnetic layer 150C) is about 20 nm to about 50 nm. The thickness of tunnel barrier layer 150B is less than each of the thickness of ferromagnetic layer 150A and the thickness of ferromagnetic layer 150C. The thickness of tunnel barrier layer 150B is sufficiently thin, such as 10 nm or less, to facilitate tunneling of electrons from ferromagnetic layer 150A to ferromagnetic layer 150C and/or vice versa. In some embodiments, a thickness of tunnel barrier layer 150B is about 0.5 nm to about 3 nm. While MTJ layers 150 include three layers in the depicted embodiment, the present disclosure contemplates MTJ layers 150 including additional layer including but not limited to, capping layers, antiferromagnetic layers, other pinned layers, pinning layers, barrier layers, multi-layer ferromagnetic layers, synthetic anti-ferromagnetic (SAF) structure, metal layers (e.g., Ru), and/or other suitable layers. For example, ferromagnetic layer 150A can include a pinning layer and a pinned layer, where the pinned layer is between the pinning layer and tunnel barrier layer 150B. MTJ layers 150 are formed over dielectric layer 120 by any suitable process, such as CVD, PECVD, HDPCVD, FCVD, PVD, ALD, MOCVD, RPCVD, LPCVD, ALCVD, APCVD, molecular beam epitaxy (MBE), pulsed laser deposition (PLD), electron beam (e-beam) epitaxy, other suitable deposition methods, or combinations thereof.

Figure 4:
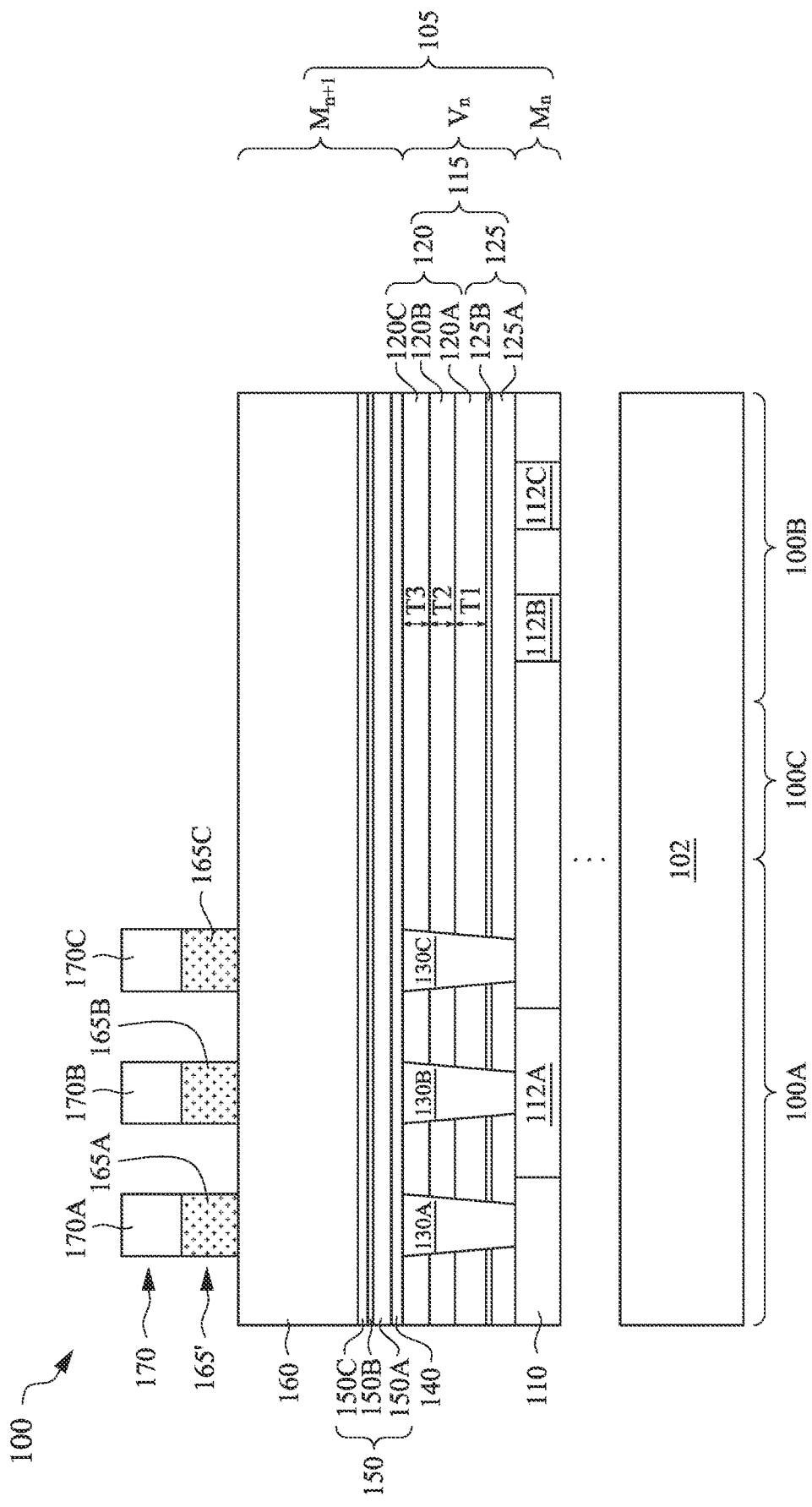
Figure 5:
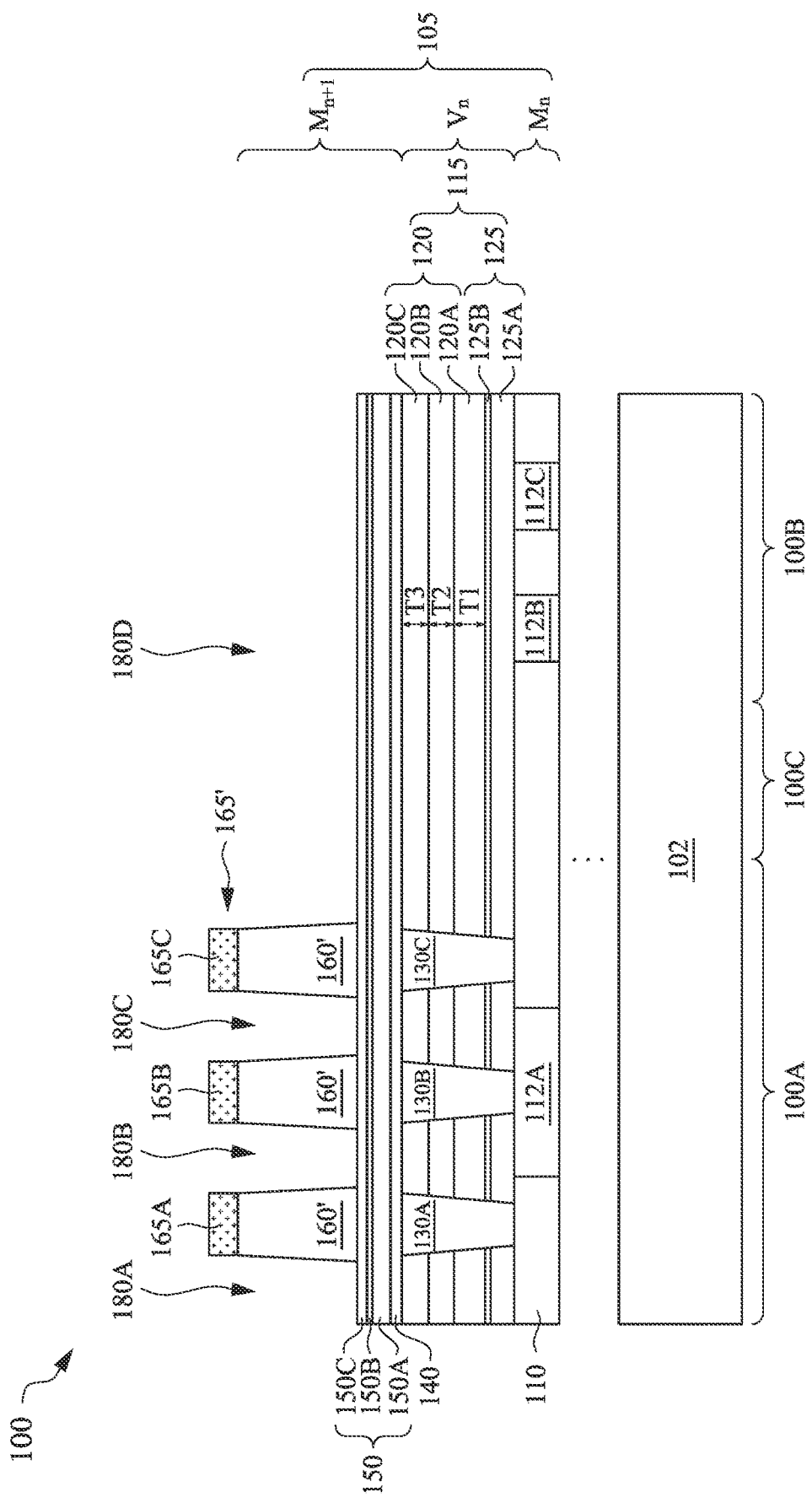
Figure 6A:
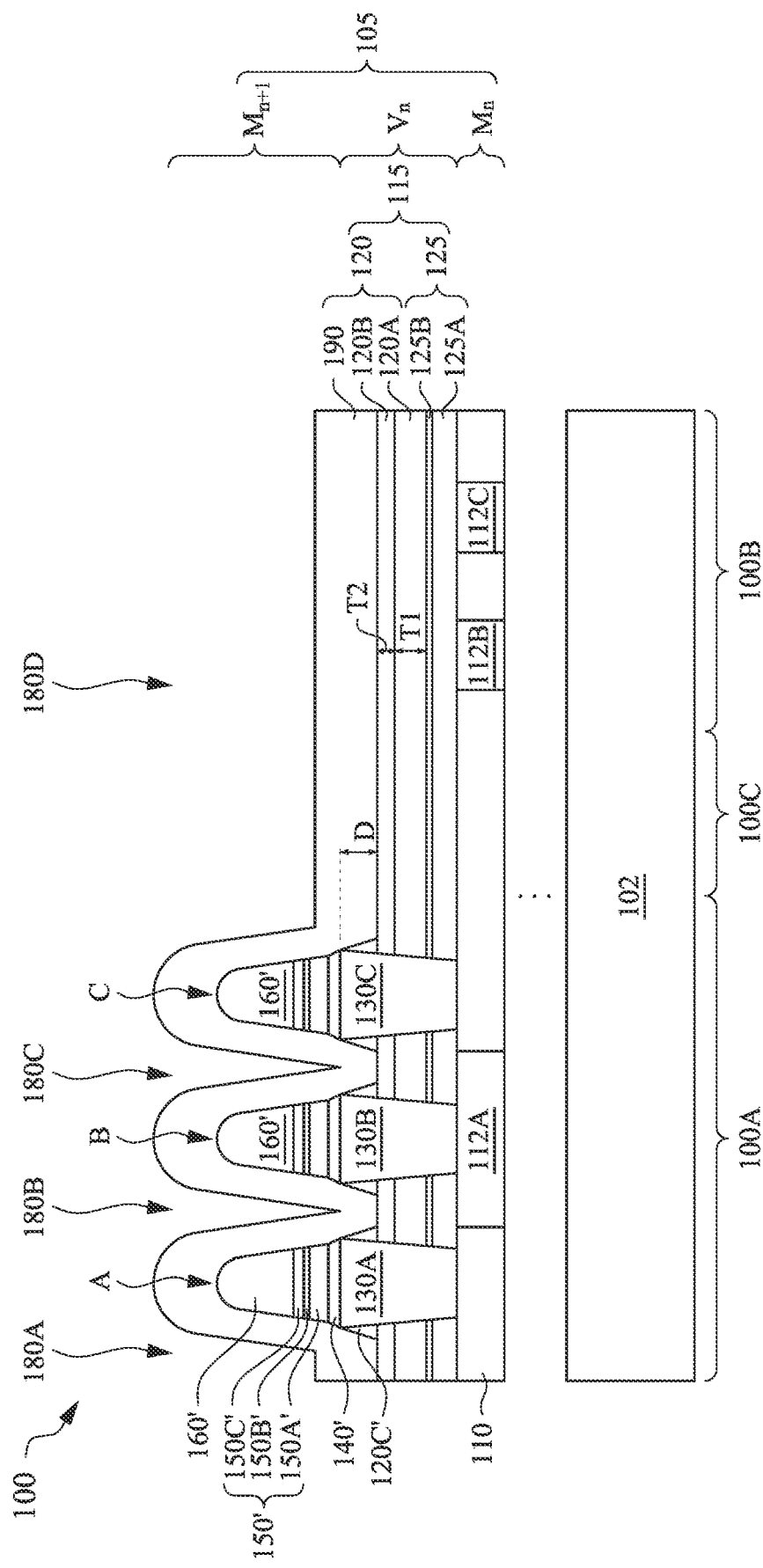

Turning to FIGS. 3-5 and FIG. 6A, top electrode layer 160, MTJ layers 150, and bottom electrode layer 140 are patterned to form at least one MRAM device, such as an MRAM cell A, an MRAM cell B, and an MRAM cell C (FIG. 6A). In some embodiments, MRAM cells A-C form an MRAM array. MRAM cells A-C (also generally referred to as MRAM bit cells and/or MRAM devices) each include a bottom electrode 140' (provided by patterning bottom electrode layer 140), an MTJ stack 150' (having a ferromagnetic layer 150A', a tunnel barrier layer 150B', and a ferromagnetic layer 150C' provided by patterning ferromagnetic layer 150A, tunnel barrier layer 150B, and ferromagnetic layer 150C, respectively), and a top electrode 160' (provided by patterning top electrode layer 160). MTJ stack 150' is vertically arranged between bottom electrode 140' and top electrode 160', where top electrode (or plate) 160' and bottom electrode (or plate) 140' may provide a conductive material for accessing MTJ stack 150' from an upper side and a lower side, respectively. In some embodiments, bottom electrode 140' and a respective underlying bottom electrode via, such as bottom electrode via 130B underlying MRAM cell B, are collectively referred to as a bottom electrode via (BEVA) structure of an MRAM cell. MTJ stack 150' uses tunnel magnetoresistance (TMR) to store magnetic fields on its upper ferromagnetic layer (e.g., ferromagnetic layer 150C') and/or its lower ferromagnetic layer (e.g., ferromagnetic layer 150A'). For sufficiently thin insulating layer thicknesses (i.e., sufficiently thin thickness of tunnel barrier layer 150B'), electrons can tunnel from ferromagnetic layer 150A' to ferromagnetic layer 150C' and/or vice versa. Data may be written to MRAM cells A-C in various manners. In an exemplary method, current is passed between an upper ferromagnetic layer and a lower ferromagnetic layer (i.e., ferromagnetic layer 150C' and ferromagnetic layer 150A', respectively), which can induce a magnetic field stored in ferromagnetic layer 150C' (e.g., a free layer). In another exemplary method, MRAM cells A-C utilize spin-transfer-torque (STT) where a spin-aligned or polarized electron flow is used to change a magnetic field within ferromagnetic layer 150C' (e.g., a free magnetic layer) with respect to ferromagnetic layer 150A' (e.g., a pinned magnetic layer). Other methods may be used to write data to MRAM cells A-C, including various data writing methods where a magnetic field is changed within a free layer with respect to a pinned layer.

In some embodiments, where MTJ stack 150' is configured with a pinned layer (e.g., ferromagnetic layer 150A') separated from a free layer (e.g., ferromagnetic layer 150C') by a thin insulator layer (e.g., tunnel barrier layer 150B'), a magnetic orientation of the pinned layer may be static, while a magnetic orientation of the free layer can switch between a parallel configuration with respect to the magnetic orientation of the pinned layer (i.e., magnetic field of the free layer aligns with magnetic field of the pinned layer in a given direction) and an anti-parallel configuration with respect to the magnetic orientation of the pinned layer (i.e., magnetic field of the free layer aligns in a direction different, such as opposite, the magnetic field of the pinned layer). Switching between the two configurations provides MTJ stack 150' with two magnetic states that can be written to or read from in memory applications. In operation, resistance of MTJ stack 150' changes in accordance with magnetic fields stored in its ferromagnetic layers (e.g., ferromagnetic layer 150A' and ferroelectric magnetic layer 150C') due to the magnetic tunnel effect. For example, when magnetic fields are aligned (i.e., the magnetic orientation of the free layer has a parallel configuration), MTJ stack 150' provides a low resistance state that corresponds with digitally storing data as a first bit value (e.g., a logical "0"). When magnetic fields are opposed (i.e., the magnetic orientation of the free layer has an anti-parallel configuration), MTJ stack 150' provides a high resistance state that corresponds with digitally storing data as a second bit value (e.g., a logical "1"). Accordingly, MRAM cells A-C can be written to by applying a write current of appropriate amplitude and/or polarity to set a magnetic state of MTJ stack 150' (and thus store a "0" or a "1") and/or read from by measuring resistance of MTJ stack 150' (i.e., measuring resistance between ferromagnetic plates of MTJ stack 150') to determine a magnetic state of MTJ stack 150' (and thus read a "0" or a "1") using any suitable read circuitry, such as by applying a voltage to a sense circuit.

Figure 3:
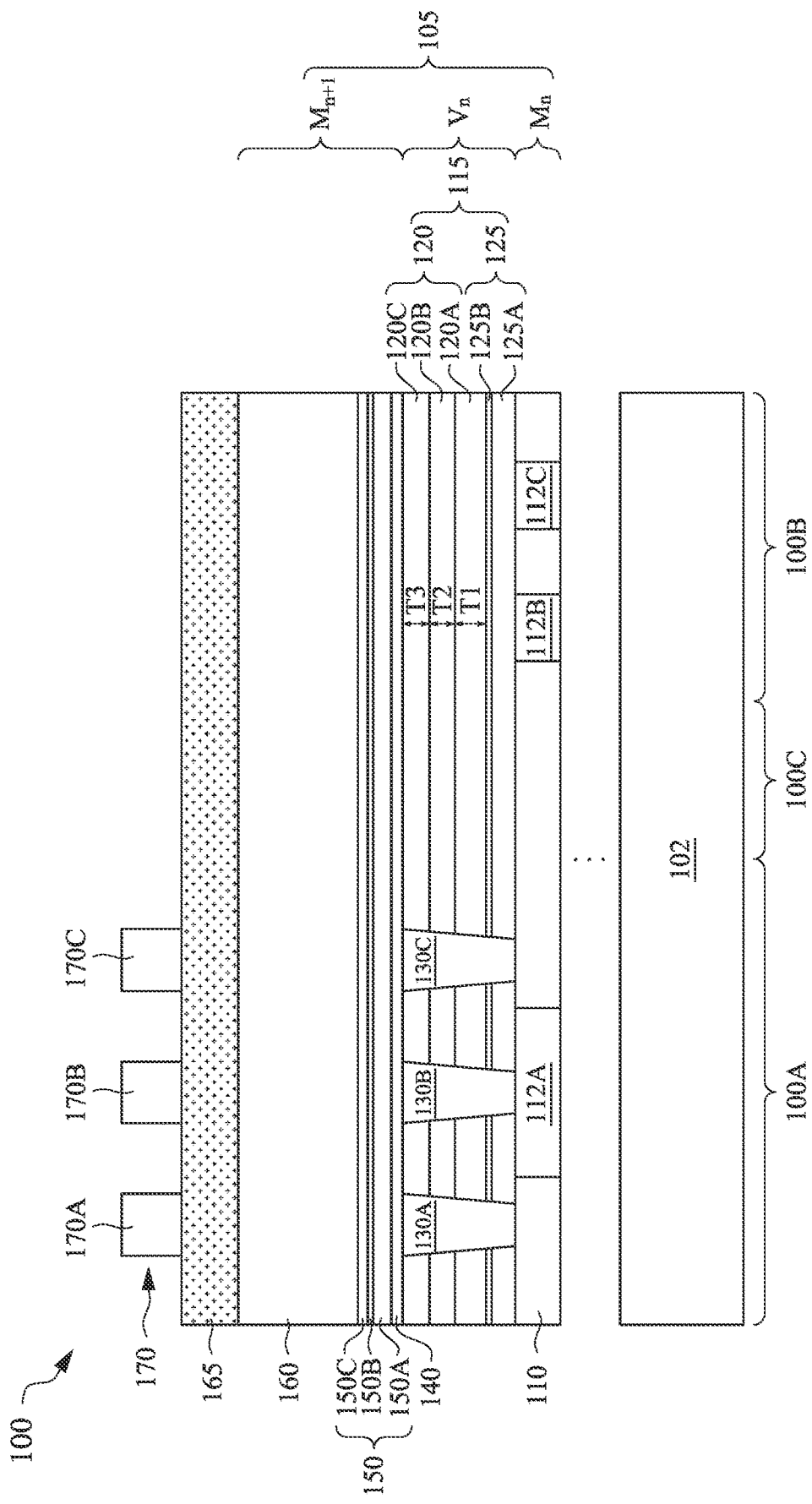

In FIGS. 3-5, fabrication proceeds with patterning top electrode layer 160 to provide top electrodes 160' of MRAM cells A-C. In some embodiments, patterning includes depositing a hard mask layer 165 over top electrode layer 160 (FIG. 3); performing a lithography process to form a patterned resist layer 170 over hard mask layer 165 (FIG. 3); performing an etching process to transfer a pattern in patterned resist layer 170 to hard mask layer 165, thereby forming a patterned hard mask layer 165' (FIG. 4); and performing an etching process to transfer a pattern in patterned hard mask layer 165' to top electrode layer 160, thereby forming top electrodes 160' (FIG. 5). In FIG. 3, hard mask layer 165 is formed over top electrode layer 160 by CVD, PECVD, HDPCVD, FCVD, PVD, ALD, MOCVD, RPCVD, LPCVD, ALCVD, APCVD, other suitable deposition methods, or combinations thereof. Hard mask layer 165 may be conformally deposited over top electrode layer 160, thereby providing hard mask layer 165 with a substantially uniform thickness over top electrode layer 160. In some embodiments, a thickness of hard mask layer 165 is about 15 nm to about 100 nm. A composition of hard mask layer 165 is different than a composition of top electrode layer 160. The composition of hard mask layer 165 is selected with respect to top electrode layer 160 to provide hard mask layer 165 and top electrode layer 160 with distinct etching sensitivities to a given etchant during a subsequent etching process. For example, hard mask layer 165 includes a material having an etch rate to an etchant that is different than an etch rate of a material of top electrode layer 160 to a given etchant so that hard mask layer 165 acts as an etch mask during etching of top electrode layer 160. For example, where top electrode layer 160 includes a metal material, hard mask layer 165 can include a dielectric material, such as silicon oxide, silicon nitride, silicon oxynitride, amorphous carbon, other suitable dielectric material, or combinations thereof. In some embodiments, hard mask layer 165 is an advanced patterning film (APF), such as an amorphous carbon layer. Though hard mask layer 165 is depicted as a single layer in FIG. 3, the present disclosure contemplates embodiments where hard mask layer 165 includes multiple layers. For example, hard mask layer 165 may have a tri-layer structure, such as a first patterning layer over top electrode layer 160, a second patterning layer over the first patterning layer, and a third patterning layer over the second patterning layer. As an example, the first patterning layer may be a silicon oxide layer, the second patterning layer may be an amorphous carbon layer, and the third patterning layer may be an amorphous silicon layer.

Patterned resist layer 170 is sensitive to radiation used during a lithography exposure process, such as ultraviolet (UV) radiation, deep UV (DUV) radiation, extreme UV (EUV) radiation, e-beam radiation, ion beam radiation, and/or other suitable radiation. Patterned resist layer 170 can include a positive tone resist material (i.e., radiation-exposed portions become soluble to a developer) or a negative type resist material (i.e., radiation-exposed portions become insoluble to a developer). In some embodiments, patterned resist layer 170 is a multilayer resist, such as a tri-layer resist having a bottom layer, a middle layer, and a top layer. In such embodiments, the bottom layer and the middle layer can include various organic and/or inorganic materials and the top layer includes a resist material. In some embodiments, the bottom layer and/or the middle layer include a silicon-containing polymer that further includes carbon, oxygen, and/or hydrogen). In some embodiments, the bottom layer is an anti-reflective coating (ARC) layer, which may be nitrogen-free in some embodiments. The lithography process can include forming a resist layer over hard mask layer 165 (for example, by spin coating a liquid resist material over hard mask layer 165), performing a pre-exposure baking process (for example, to evaporate solvent and to densify the liquid resist material), performing an exposure process using a mask, performing a post-exposure baking process, and performing a developing process. During the exposure process, the resist layer is exposed to radiation energy (such as UV light, DUV light, or EUV light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, patterned resist layer 170 includes a resist pattern that corresponds with the mask and, in the depicted embodiment, corresponds with an MRAM pattern for fabricating MRAM devices of workpiece 100. For example, patterned resist layer 170 includes a mask feature 170A, a mask feature 170B, and a mask feature 170C that cover portions of workpiece 100 that correspond with locations of MRAM cells A-C, respectively. In FIG. 3, mask features 170A-170C are substantially vertically aligned with and cover bottom electrode vias 130A-130C and material layers disposed between, respectively, mask features 170A-170C and bottom electrode vias 130A-130C (i.e., portions of hard mask layer 165, top electrode layer 160, MTJ layers 150, and bottom electrode layer 140 disposed respectively therebetween). Openings in patterned resist layer 170, such as those formed by and/or between mask features 170A-170C in FIG. 3, expose portions of hard mask layer 165, top electrode layer 160, MTJ layers 150, and/or bottom electrode layer 140 to be removed from workpiece 100. In some embodiments, mask features 170A-170C can be referred to as mask pillars, where patterned resist layer 170 provides an array of mask pillars, each corresponding with an MRAM device of an MRAM array.

In FIG. 4, the etching process removes portions of hard mask layer 165 using patterned resist layer 170 as an etch mask, thereby providing patterned hard mask layer 165'. For example, the etching process removes exposed portions of hard mask layer 165 (i.e., portions not covered by patterned resist layer 170), thereby exposing portions of top electrode layer 160 thereunder and leaving a hard mask feature 165A, a hard mask feature 165B, and a hard mask feature 165C under and corresponding with mask features 170A-170C, respectively. In some embodiments, the etching process selectively etches hard mask layer 165 with minimal (to no) etching of patterned resist layer 170 and/or top electrode layer 160. For example, an etchant is selected for the etching process that etches the material of hard mask layer 165 (e.g., dielectric material) at a higher rate than the material of patterned resist layer 170 (e.g., resist material) and/or the material of top electrode layer 160 (e.g., metal material) (i.e., the etchant has a high etch selectivity with respect to the material of hard mask layer 165). The etching process is a dry etching process, a wet etching process, other suitable etching process, or combinations thereof. In some embodiments, the etching process exposes hard mask layer 165 to an etchant for a time sufficient to etch through hard mask layer 165 and expose top electrode layer 160. In some embodiments, the etching process removes exposed portions of hard mask layer 165. In some embodiments, the etching process is a multi-step etching process, for example, that separately and alternately etches each layer of hard mask layer 165. In some embodiments, the etching process is a single, continuous etch that can etch the various layers of hard mask layer 165 (i.e., the etching process has low etching selectivity between the various layers). In some embodiments, the etching process partially etches patterned resist layer 170, thereby reducing a thickness of mask features 170A-170C. In some embodiments, after the etching process, patterned resist layer 170 is removed, for example, by a resist stripping process or other suitable process. In some embodiments, patterned resist layer 170 or a remainder thereof is removed by the etching process implemented to pattern top electrode layer 160 in FIG. 5.

In FIG. 5, the etching process removes portions of top electrode layer 160 using patterned hard mask layer 165' as an etch mask, thereby providing top electrodes 160' of MRAM cells A-C. For example, the etching process removes exposed portions of top electrode layer 160 (i.e., portions not covered by hard mask features 165A-165C) and forms openings in top electrode layer 160 that expose MTJ layers 150, such as an opening 180A, an opening 180B, an opening 180C, and an opening 180D. Unexposed, remaining portions of top electrode layer 160 (i.e., portions covered by hard mask features 165A-165C) form top electrodes 160'. Top electrode 160' of MRAM cell A interposes opening 180A and opening 180B, top electrode 160' of MRAM cell B interposes opening 180B and opening 180C, and top electrode 160' of MRAM cell C interposes opening 180C and opening 180D. Opening 180B provides spacing between and separates top electrodes 160' of MRAM cell A and MRAM cell B, and opening 180C provides spacing between and separates top electrodes 160' of MRAM cell B and MRAM cell C. Opening 180A provides spacing between and separates top electrode 160' of MRAM cell A from a left edge of memory region 100A and opening 180D provides spacing between and separates top electrode 160' of MRAM cell C from a right edge of memory region 100A. In FIG. 5, the etching process removes top electrode layer 160 from logic region 100B and intermediate region 100C of workpiece 100, such that opening 180D spans memory region 100A, logic region 100B, and intermediate region 100C. Further, in the depicted embodiment, top electrodes 160' have tapered sidewalls that extend between a top of top electrodes 160' that abuts hard mask features 165A-165C and a bottom of top electrodes 160' that abuts ferromagnetic layer 150C. In some embodiments, after the etching process, MRAM cells A-C have trapezoidal-shaped top electrodes 160'. In some embodiments, top electrodes 160' have a width that increases from patterned hard mask layer 165' to MTJ layers 150. For example, top electrodes 160' have a width that increases from a first width that is about equal to a width of hard mask features 165A-165C to a second width that is greater than the first width.

The etching process for patterning top electrode layer 160 is a dry etching process, a wet etching process, other suitable etching process, or combinations thereof. In some embodiments, the etching process selectively etches top electrode layer 160 with minimal (to no) etching of patterned hard mask layer 165' and MTJ layers 150 (in particular, ferromagnetic layer 150C). For example, an etchant is selected for the etching process that etches the material of top electrode layer 160 (e.g., metal material) at a higher rate than the material of patterned hard mask layer 165' (e.g., dielectric material) and/or the material of ferromagnetic layer 150C (e.g., magnetic metal material) (i.e., the etchant has a high etch selectivity with respect to the material of top electrode layer 160). In some embodiments, the etching process exposes top electrode layer 160 to an etchant for a time sufficient to etch through top electrode layer 160 and expose ferromagnetic layer 150C. In some embodiments, such as depicted, the etching process partially removes (etches) patterned hard mask layer 165', thereby reducing a thickness of hard mask features 165A-165C. In some embodiments, patterned hard mask layer 165' or remainder thereof is removed by a suitable process after the etching process patterns top electrode layer 160. In some embodiments, patterned hard mask layer 165' or remainder thereof is removed during patterning associated with FIG. 6A, such as patterning of MTJ layers 150 and/or bottom electrode layer 140, and/or is used as an etch mask during patterning associated with FIG. 6A. In some embodiments, the etching process also uses patterned resist layer 170 or remainder thereof as an etch mask when patterning top electrode layer 160. In some embodiments, patterned resist layer 170 or remainder thereof is removed during patterning/etching associated with FIG. 5.

In the depicted embodiment, top electrode layer 160 is patterned by a reactive ion etch (RIE), which is a type of dry etching process. RIE removes material with a combination of chemical etch and physical etch. For example, RIE typically involves generating a chemically reactive plasma that includes radicals (e.g., chemically reactive species), ions, neutrals, electrons, and/or photons, where a material is removed when the radicals and/or the ions react with a surface of the material (e.g., by adsorbing on the surface of the material and triggering chemical reactions with the material that produce volatile by-products that desorb from the surface of the material (i.e., portions of the material removed by chemical etch)) and when the ions bombard the surface of the material with sufficiently high energy to eject (or knock) atoms out of the material (i.e., portions of the material removed by physical etch). Material removal resulting from chemical etch dominates RIE, while the physical etch during RIE accelerates and/or enhances the material removal achieved by the chemical etch. Accordingly, RIE is often referred to as a chemical dry etch technique. RIE provides desired etch selectivity between hard mask features 165A-165C and top electrode layer 160. In some embodiments, top electrode layer 160 is patterned by an RIE that applies power, such as radio frequency (RF) power, to a fluorine-containing gas (e.g., $CF_4$) to generate a fluorine-containing plasma, where the exposed portions of top electrode layer 160 are removed (etched) by plasma-excited fluorine-containing species (i.e., ionized reactive gases) during the RIE. In some embodiments, the RIE can, alternatively or additionally, generate a plasma-excited species for etching from a hydrogen-containing etch gas, a nitrogen-containing etch gas, a chlorine-containing etch gas, an oxygen-containing etch gas, a bromine-containing etch gas, an iodine-containing etch gas, other suitable etch gas, or combinations thereof. In some embodiments, a carrier gas is used to deliver the fluorine-containing etch gas and/or other etch gas. The carrier gas may be an inert gas, such as an argon-containing gas, a helium-containing gas, a xenon-containing gas, other suitable inert gas, or combinations thereof. Various etch parameters of the RIE can be tuned to achieve selective etching of top electrode layer 160 relative to other layers, such as etch gas composition, carrier gas composition, etch gas flow rate, carrier gas flow rate, etch time, etch pressure, etch temperature, source power, RF bias voltage, direct current (DC) bias voltage, RF bias power, DC bias power, other suitable etch parameters, or combinations thereof. In some embodiments, top electrode layer 160 is patterned by ion beam etch (IBE), RIE, other suitable dry etching process, other suitable wet etching process, or combinations thereof.

In FIG. 6A and FIG. 9, processing continues with patterning MTJ layers 150 and bottom electrode layer 140 to form MTJ stacks 150' and bottom electrodes 140', respectively, therefrom. For example, an etching process removes portions of MTJ layers 150 and bottom electrode layer 140 using top electrodes 160' as an etch mask, thereby providing MTJ stacks 150' and bottom electrodes 140' of MRAM cells A-C. In some embodiments, the etching process removes exposed portions of MTJ layers 150 and bottom electrode layer 140 (i.e., portions not covered by top electrodes 160') and extends openings 180A-180D through MTJ layers 150 and bottom electrode layer 140 to expose dielectric layer 120B. Unexposed, remaining portions of MTJ layers 150 and bottom electrode layer 140 (i.e., portions covered by top electrodes 160') form MTJ stacks 150' and bottom electrodes 140', respectively. The etching process exposes workpiece 100 to an etchant for a time sufficient to etch through MTJ layers 150 and bottom electrode layer 140 and extend openings 180A-180D to a depth D in ILD layer 120 to ensure separation and isolation of MRAM cells A-C from one another (i.e., disconnect MTJ stacks 150' and/or bottom electrodes 140' of adjacent MRAM cells). The etching process also removes MTJ layers 150 and bottom electrode layer 140 from logic region 100B and intermediate region 100C of workpiece 100, so that logic region 100B and intermediate region 100C do not have memory structures and/or memory layers therein. Put another way, the etching process over etches into ILD layer 120, thereby etching back ILD layer 120 by depth D. For example, the etching process removes exposed portions of dielectric layer 120C and extends openings 180A-180D through dielectric layer 120C to dielectric layer 120B in memory region 100A, logic region 100B, and intermediate region 100C. In the depicted embodiment (FIG. 6A and FIG. 9), the etching process stops at dielectric layer 120B between adjacent MRAM cells A-C and at a memory cell edge and/or memory cell edge region, such as left/right edges of memory region 100A and intermediate region 100C (which together can be referred to as a memory cell edge region). Dielectric layer 120B thus functions as an etch stop layer when patterning MTJ layers 150 and bottom electrode layer 140.

Remaining portions of dielectric layer 120C in memory region 100A form spacers 120C' along sidewalls of top portions of bottom electrode vias 130A-130C, and dielectric layer 120B and dielectric layer 120A remain extending continuously between adjacent MRAM cells A-C. In such embodiments, depth D of openings 180A-180D in ILD layer 120 is about equal to thickness T3 of dielectric layer 120C. Spacers 120C' have tapered sidewalls that extend from tops of spacers 120C' that abut bottom electrodes 140' to bottoms of spacers 120C' that abut dielectric layer 120B. In embodiments where bottom electrodes 140' are wider than bottom electrode vias 130A-130C, such as depicted, trapezoidal-shaped spacers 120C' form to adjacent bottom electrode vias 130A-130C. In some embodiments, where bottom electrodes 140' and bottom electrode vias 130A-130C have about equal widths or bottom electrode vias 130A-130C are wider than bottom electrodes 140', triangular-shaped spacers 120C' may form adjacent to bottom electrode vias 130A-130C. In some embodiments, such as where spacers 120C' are trapezoidal-shaped or triangular-shaped, a width of spacers 120C' increases from tops of bottom electrode vias 130A-130C to dielectric layer 120B. The present disclosure contemplates spacers 120C' having other shapes and/or other profiles depending on design requirements.

In some embodiments, MTJ stacks 150' have tapered sidewalls that extend between tops of MTJ stacks 150' that abut top electrodes 160' and bottoms of MTJ stacks 150' that abut bottom electrodes 140'. In such embodiments, MRAM cells A-C have trapezoidal-shaped MTJ stacks 150'. In some embodiments, MTJ stacks 150' have a width that increases from top electrodes 160' to bottom electrodes 140'. For example, a width of MTJ stacks 150' may increase from a first width that is about equal to a width of top electrodes 160' (in the depicted embodiment, a largest width of top electrodes 160') to a second width that is greater than the first width, where the second width is about equal to a width of bottom electrodes 140' (in the depicted embodiment, a smallest width of bottom electrodes 140').

In some embodiments, bottom electrodes 140' have tapered sidewalls that extend between tops of bottom electrodes 140' that abut MTJ stacks 150' and bottoms of bottom electrodes 140' that abut bottom electrode vias 130A-130C. In such embodiments, MRAM cells A-C have trapezoidal-shaped bottom electrodes 140'. In some embodiments, bottom electrodes 140' have a width that increases from MTJ stacks 150' to bottom electrode vias 130A-130C. For example, a width of bottom electrodes 140' may increase from a first width that is about equal to a width of MTJ stacks 150' (in the depicted embodiment, a largest width of MTJ stacks 150') to a second width that is greater than the first width, where the second width is greater than a width of bottom electrode vias 130A-130C (in the depicted embodiment, a largest width of bottom electrode vias 130A-130C). In some embodiments, such as depicted in FIG. 6A and FIG. 9, bottom electrodes 140' extend laterally beyond sidewalls of bottom electrode vias 130A-130C and physically contact tops of sidewall spacers 120C' and tops of bottom electrode vias 130A-130C. In some embodiments, the second width is about equal to the width of bottom electrode vias 130A-130C, such that bottom electrodes 140', bottom electrode vias 130A-130C, and sidewall spacers 120C' physically contact at an interface therebetween. In some embodiments, the second width is less than the width of bottom electrode vias 130A-130C, such that bottom electrodes 140' do not physically contact spacers 120C'.

In some embodiments, because top electrodes 160' and bottom electrode layer 140 both include metal materials (and, in some embodiments, include the same metal materials), the etching process partially removes (etches) top electrodes 160', thereby reducing a thickness of top electrodes 160' and/or modifying a profile and/or a shape of top electrodes 160'. For example, the etching process causes rounding of top electrodes 160', resulting in semi-oval shaped top electrodes 160' as depicted in FIG. 6A. In some embodiments, semi-oval shaped top electrodes 160' have a rounded top surface and a bottom surface that extends from one end of the rounded top surface to a second end of the rounded top surface. Semi-oval shaped top electrodes 160' may also have a width that increases from a top of semi-oval shaped top electrodes 160' to MTJ stacks 150'. In some embodiments, a thickness of top electrode layer 160 (and thus top electrodes 160') is greater than a thickness of bottom electrode layer 140 to ensure that top electrodes 160' remain after etching bottom electrode layer 140. In some embodiments, the etching process causes bowing and/or slight inward curvature of sidewalls of MTJ stacks 150' and/or sidewalls of bottom electrodes 140'. In such embodiments, such as depicted, MRAM cells A-C have rounded v-shaped cross-sectional profiles. The present disclosure contemplates top electrodes 140', MTJ stacks 150', bottom electrodes 140', and/or MRAM cells A-C having other shapes and/or other profiles depending on design requirements of MRAM cells A-C.

The etching process for patterning MTJ layers 150 and bottom electrode layer 140 is a dry etching process, a wet etching process, other suitable etching process, or combinations thereof. It has been observed that MTJ stacks formed by patterning MTJ layers and bottom electrode layers with RIE sustain sidewall damage that can degrade MTJ performance and/or degrade magnetic properties of MTJ layers of MTJ stacks. For example, radicals and/or ions of an RIE's chemically reactive plasma, oxygen, moisture, and/or other chemicals during the RIE may react with exposed sidewalls of the MTJ layers, particularly during etching of the bottom electrode layers. To minimize (and, in some embodiments, eliminate) sidewall damage to MTJ stacks that result from chemical reactions, such as those that may occur during RIE, the present disclosure patterns MTJ layers 150 and bottom electrode layer 140 with an ion beam etch (IBE), which is also a type of dry etching process. In contrast to RIE, IBE removes material primarily by physical etch (i.e., a majority of material removal is achieved without chemical reactions). For example, IBE involves generating an inert plasma that includes inert gas (noble gas) ions, where a material is removed by bombarding a surface of the material with the inert gas ions (i.e., directing an ion beam to the surface) to eject (or knock) atoms out of the material (i.e., physical etch). The inert gas may be an argon-containing gas, a xenon-containing gas, a krypton-containing gas, a neon-containing gas, other suitable inert gas, or combinations thereof, such that IBE bombards the material with argon ions, xenon ions, krypton ions, neon ions, and/or other suitable inert gas ions (e.g., helium ions). The present disclosure also contemplates embodiments where MTJ layers 150 and bottom electrode layer 140 are patterned by reactive IBE (RIBE) or chemically assisted IBE (CAIBE), both of which involve a chemical etch component. For example, RIBE and/or CAIBE may enhance physical etch selectivity and/or achieve different etch rates between materials by adding reactive ion species (e.g., $CHF_3$, $SF_6$, $N_2$, $O_2$, $Cl_2$, $CF_4$, and/or other suitable reactive ion species) to the inert gas from which the inert plasma is generated or to/through a gas ring located at a wafer stage that secures workpiece 100 for processing, respectively. In such embodiments, material removal resulting from physical etch still dominates IBE, while the chemical etch during IBE accelerates and/or enhances the material removal achieved by the physical etch. In other words, a majority of material removal (i.e., greater than 50%) by RIBE and/or CAIBE is from physical etch mechanisms, in contrast to RIE, where a majority of material removal is from chemical etch mechanisms. Accordingly, RIBE and/or CAIBE are also considered physical dry etch techniques.

In some embodiments, MTJ layers 150 and bottom electrode layer 140 are patterned by an IBE that applies power, such as RF power, to an argon-containing gas (i.e., an inert gas) to generate an argon-containing plasma, where the exposed portions of MTJ layers 150 and bottom electrode layer 140 are removed (etched) by an argon ion beam (i.e., plasma-excited argon-containing species) during the IBE. In some embodiments, the IBE can, alternatively or additionally, generate an ion beam from other suitable inert gases. Various etch parameters of the IBE can be tuned to achieve desired etching of MTJ layers 150 and/or bottom electrode layer 140, such as etch gas composition, etch gas flow rate, etch time, etch pressure, etch temperature, source power, RF bias voltage, DC bias voltage, RF bias power, DC bias power, other suitable etch parameters, or combinations thereof. In some embodiments, a tilt angle of the IBE is tuned to achieve desired etching of MTJ layers 150 and/or bottom electrode layer 140. The tilt angle is between an ion beam and a normal to a top surface of device substrate 102, a top surface of MLI feature 105, a top surface of MTJ layers 150, and/or a top surface of bottom electrode layer 140. In some embodiments, workpiece 100 is rotated during IBE. In some embodiments, IBE is implemented with time mode control, where IBE of MTJ layers 150 and bottom electrode layer 140 stops after a time determined sufficient for etching through MTJ layers 150 and bottom electrode layer 140. In some embodiments, IBE is implemented with end mode control, where IBE of MTJ layers 150 and bottom electrode layer 140 stops at ILD layer 120. Incorporating dielectric layer 120B into ILD layer 120 improves control of IBE of MTJ layers 150 and bottom electrode layer 140 by improving IBE etch selectivity of MTJ/bottom electrode patterning processes compared to conventional MRAM fabrication methods and/or techniques.

For example, although IBE produces effectively no chemical damage and leaves minimal plasma damage to MTJ stacks compared to RIE, the present disclosure has recognized two shortcomings of IBE when implemented to form MTJ stacks and bottom electrodes of MRAM cells. First, MTJ layers and bottom electrode layer are typically formed over a single ILD layer (having bottom electrode vias disposed therein) that has an etch rate to IBE that is greater than an etch rate of bottom electrode layer to IBE. IBE will thus etch the single ILD layer faster than bottom electrode layer, such that the single ILD layer functions poorly (and, in some instances, cannot function) as an etch stop layer when patterning bottom electrode layer with IBE. For example, in conventional MRAM fabrication techniques where the single ILD layer is a silicon oxide layer, IBE will etch the silicon oxide layer faster than bottom electrode layer because the silicon oxide layer is softer than bottom electrode layer and an etch rate of the silicon oxide layer to IBE is greater than an etch rate of bottom electrode layer to IBE (for example, an IBE etch rate ratio of silicon oxide (e.g., SiOx) to an etch rate of bottom electrode layer is about 2:1). Further, such IBE etch selectivity to the underlying dielectric layer (i.e., the single ILD layer) provides little control over recessing (etching back) of the single ILD layer, particularly in less densely populated regions of a workpiece, such as intermediate region 100C and/or logic region 100B. For example, IBE may recess the single ILD layer more in a memory cell edge region, such as intermediate region 100C, and/or a logic region, such as logic region 100B, of a workpiece than the single ILD layer in a memory region of a workpiece, such as memory region 100A (which is populated with closely spaced patterns of material layers, such as MTJ layers and bottom electrodes). Depth variations of the recesses in the single ILD layer and the inability to control such depth variations and/or IBE over etching can unintentionally damage the memory cell edge region and/or the logic region, for example, by over etching into and damaging underlying $M_n$ metal layer. Second, since IBE is non-volatile in nature (i.e., particles of material are physically ejected from a material), metal material, particles, and/or atoms removed from MTJ layers and/or bottom electrode layer during IBE often redeposit along sidewalls of MTJ stacks and/or bottom electrodes. In some instances, metal material redeposits along sidewalls of an MTJ stack in a manner that electrically shorts the MTJ stack's corresponding MRAM cell, which can render the MRAM cell unusable. In some instances, metal material redeposits along sidewalls of an MTJ stack in a manner that provides a shunt for ferromagnetic layers of the MTJ stack (i.e., a redeposited metal layer creates an alternative low-resistance path for electrical current to flow between ferromagnetic layers of the MTJ stack, instead of through tunnel barrier layer of the MTJ stack), which degrades tunnel magnetoresistance ratio (TMR).

The disclosed MRAM fabrication process overcomes such challenges by implementing a multilayer ILD layer under bottom electrode layer 140, in particular, a multilayer ILD layer having a metal-containing dielectric layer disposed therein that is harder than a silicon oxide layer and has an etch rate to IBE that is greater than an etch rate of the silicon oxide layer to IBE, and in some embodiments, has an etch rate to IBE that is greater than an etch rate of MTJ layers and/or bottom electrode layer. The metal-containing dielectric layer disposed within the ILD layer is thus more resistant to IBE than a silicon oxide layer and can function as an IBE etch stop layer. In the depicted embodiment, where dielectric layer 120B is a metal-containing dielectric layer in ILD layer 120, an etch rate to IBE of dielectric layer 120B is greater than an etch rate to IBE of a silicon oxide layer (e.g., dielectric layer 120C). For example, an IBE etch rate ratio of an etch rate of dielectric layer 120B to an etch rate of silicon oxide is about 1:2 to about 1:4, such that when IBE of MTJ layers 150 and bottom electrode layer 140 over etches into ILD layer 120, IBE will stop or significantly slow down at dielectric layer 120B. In some embodiments, the IBE etch rate ratio is about 1:3 to optimize IBE etch selectivity between dielectric layer 120C and dielectric layer 120B and thus optimize etch stop functionality of dielectric layer 120B. In some embodiments, an IBE etch rate ratio of an etch rate of dielectric layer 120B to an etch rate of MTJ layers 150 and/or bottom electrode layer 140 is about 1:1 and an IBE etch rate ratio of an etch rate of a silicon oxide layer to an etch rate of MTJ layers 150 and/or bottom electrode layer 140 that is about 2:1. IBE may accordingly etch dielectric layer 120B, MTJ layer 150, and/or bottom electrode layer 140 slower than silicon oxide.

Incorporating dielectric layer 120B into ILD layer 120 to increase IBE etch selectivity also improves ILD recess control and/or IBE over etch into a dielectric layer having bottom electrode vias disposed therein compared to conventional MRAM fabrication methods. For example, in FIG. 6A, because IBE has low etch selectivity to dielectric layer 120B relative to dielectric layer 120C, recessing of dielectric layer 120C (e.g., silicon-containing dielectric layer, such as a silicon oxide layer) by IBE is well controlled and IBE stops at dielectric layer 120B in memory region 100A, logic region 100B, and intermediate region 100C (i.e., memory cell edge region). ILD layer 120 is thus recessed to depth D between MRAM cells A-C in memory region 100A, depth D in logic region 100B, and depth D in intermediate region 100C. Since depth D is less than a total thickness of ILD layer 120, underlying layers in logic region 100B, such as $M_n$ metal layer in logic region 100B, are not damaged by IBE used to form MTJ stacks 150' and bottom electrodes 140'. In some embodiments, thickness T3 of dielectric layer 120C is equal to a maximum allowable depth for recessing ILD layer 120, where depths greater than the maximum allowable depth may result in damage to underlying layers, such as $M_n$ metal layer. In the depicted embodiment, IBE stops upon reaching a top surface of dielectric layer 120B. In some embodiments, IBE partially removes dielectric layer 120B, thereby reducing a thickness of dielectric layer 120B. In such embodiments, the thickness of dielectric layer 120B after patterning MTJ layers 150 and bottom electrode layer 140 is less than thickness T2.

Incorporating dielectric layer 120B also enhances isolation and/or insulation of MRAM cells A-C and protects sidewalls of MTJ stacks 150'. For example, as depicted in FIG. 9, during IBE of MTJ layers 150, bottom electrode layer 140, dielectric layer 120C, and/or dielectric layer 120B, metal-containing dielectric particles and/or metal-containing dielectric material ejected from (or knocked loose) from dielectric layer 120B redeposit on sidewalls of MRAM cells A-C, thereby forming metal-containing dielectric spacers 185 along sidewalls of MRAM cells A-C. Metal-containing dielectric spacers 185 include a metal-containing dielectric material, such as metal oxide (e.g., aluminum oxide), which is a good insulator and enhances insulation of sidewalls of MRAM cells A-C. Metal-containing dielectric spacers 185 can also prevent sidewall shunts from forming on MRAM cells A-C, such as those described above, which improves MTJ performance. In the depicted embodiment, metal-containing dielectric spacers 185 have portions 185A on sidewalls of bottom electrodes 140', portions 185B on sidewalls of MTJ stacks 150', portions 185C on sidewalls of top electrodes 160', and portions 185D on sidewalls of spacers 120C'. An amount of metal-containing dielectric material redeposited may vary along sidewalls of an MRAM structure. For example, an amount of metal-containing dielectric material deposited on a sidewall of a portion of an MRAM structure decreases as a vertical distance between dielectric layer 120B and the sidewall of the portion of the MRAM structure increases. Accordingly, a thickness of redeposited metal-containing dielectric material along sidewalls of a bottom of an MRAM structure may be greater than a thickness of redeposited metal-containing dielectric material along sidewalls of a top of the MRAM structure. In FIG. 9, metal-containing dielectric spacers 185 have a thickness t that increases from a top of MRAM structure (i.e., top electrodes 160') to a bottom of MRAM structure (i.e., bottom electrodes 140', or in some embodiments, spacers 120C'). In some embodiments, a thickness of portions 185C is less than a thickness of portions 185B, which is less than a thickness of portions 185A, which is less than a thickness of portions 185D. In some embodiments, thickness t is controlled by tuning IBE. For example, thickness t can be increased by over etching dielectric layer 120B to increase an amount of metal-containing dielectric material removed from dielectric layer 120B and/or increase an amount of time for metal-containing dielectric material to redeposit on sidewalls of the MRAM structure. In another example, etch parameters of IBE can be tuned to increase an amount of metal-containing dielectric material that is removed from dielectric layer 120B by an ion beam and is thus available for redepositing along sidewalls of the MRAM structure.

Re-deposited metal-containing dielectric material may disappear near a top of the MRAM structure. For example, in FIG. 9, metal-containing dielectric spacers 185 are disposed over bottoms, but not tops, of top electrodes 160'. In some embodiments, such as depicted, portions 185C partially cover sidewalls of top electrodes 160', while portions 185B, portions 185A, and portions 185D fully cover sidewalls of MTJ stacks 150', sidewalls of bottom electrodes 140', and sidewalls of spacers 120C', respectively. In such embodiments, metal-containing dielectric spacers 185 extend continuously along sidewalls of MRAM structures, from portions 185D to portions 185A to portions 185B to portions 185C. In some embodiments, metal-containing dielectric spacers 185 are formed from discrete and separate metal-containing dielectric portions formed on sidewalls of MRAM structure. For example, metal-containing dielectric spacers 185 may include portions that partially and/or fully cover sidewalls of bottom electrodes 140', sidewalls of MTJ stacks 150', sidewalls of top electrodes 160', and/or sidewalls of spacers 120C'. In some embodiments, metal-containing dielectric spacers 185 may include discrete portions of metal-containing dielectric material randomly arranged on sidewalls of bottom electrodes 140', sidewalls of MTJ stacks 150', sidewalls of top electrodes 160', and/or sidewalls of spacers 120C'. Any configuration of metal-containing dielectric material that results from IBE to form metal-containing dielectric spacers 185 is contemplated.

Figure 6B:
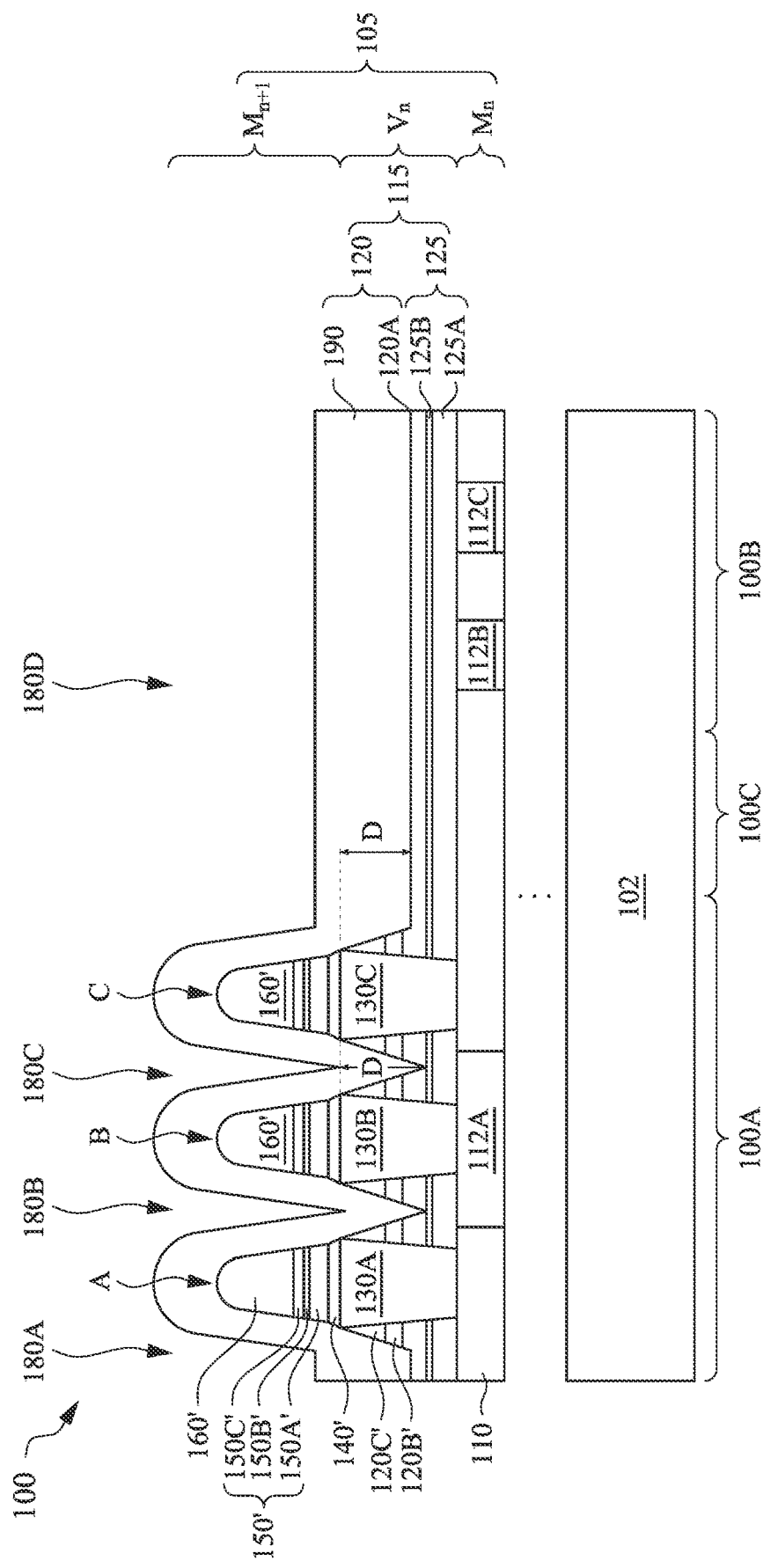

FIG. 6B illustrates an alternative embodiment of workpiece 100 after patterning MTJ layers 150 and bottom electrode layer 140. In this embodiment, IBE extends openings 180A-180D through dielectric layer 120B to expose dielectric layer 120A (i.e., IBE punches through metal-containing dielectric layer to silicon-containing dielectric layer). IBE further partially etches (recesses) dielectric layer 120A, such that after IBE, a thickness of dielectric layer 120A is less than thickness T1 and depth D is greater than a sum of thickness T1 and thickness T2 but less than a total thickness of ILD layer 120. In such embodiments, dielectric layer 120B and dielectric layer 120C are removed from logic region 100B and intermediate region 100C (i.e., memory cell edge region). In some embodiments, depth D in logic region 100B and/or intermediate region 100C (e.g., of opening 180D) is less than depth D in memory region 100A (e.g., of opening 180B and opening 180C). Further, in memory region 100A, dielectric layer 120A, but not dielectric layer 120B and dielectric layer 120C, extend continuously between adjacent bottom electrode vias 130A-130C. Even further, etching dielectric layer 120B forms metal-containing dielectric spacers 120B' under spacers 120C' and along sidewalls of middle portions of bottom electrode vias 130A-130C. Metal-containing dielectric spacers 120B' have tapered sidewalls that extend from tops of metal-containing dielectric spacers 120B' that abut spacers 120C' to bottoms of metal-containing dielectric spacers 120B' that abut dielectric layer 120A. In some embodiments, metal-containing dielectric spacers 120B' are trapezoidal-shaped, and a width of metal-containing dielectric spacers 120B' increases from spacers 120C' to dielectric layer 120A. The present disclosure contemplates metal-containing dielectric spacers 120B' having other shapes and/or other profiles depending on design requirements of MRAM cells A-C. Accordingly, the embodiment of FIG. 6B provides ILD layer 120 with v-shaped recesses between MRAM cells A-C that have sidewalls formed by spacers 120C', metal-containing dielectric spacer 120B', and dielectric layer 120A, while the embodiment of FIG. 6A provides ILD layer 120 with trapezoidal-shaped recesses between MRAM cells A-C that have sidewalls formed by spacers 120C' and bottoms formed by dielectric layer 120B.

Figure 6C:
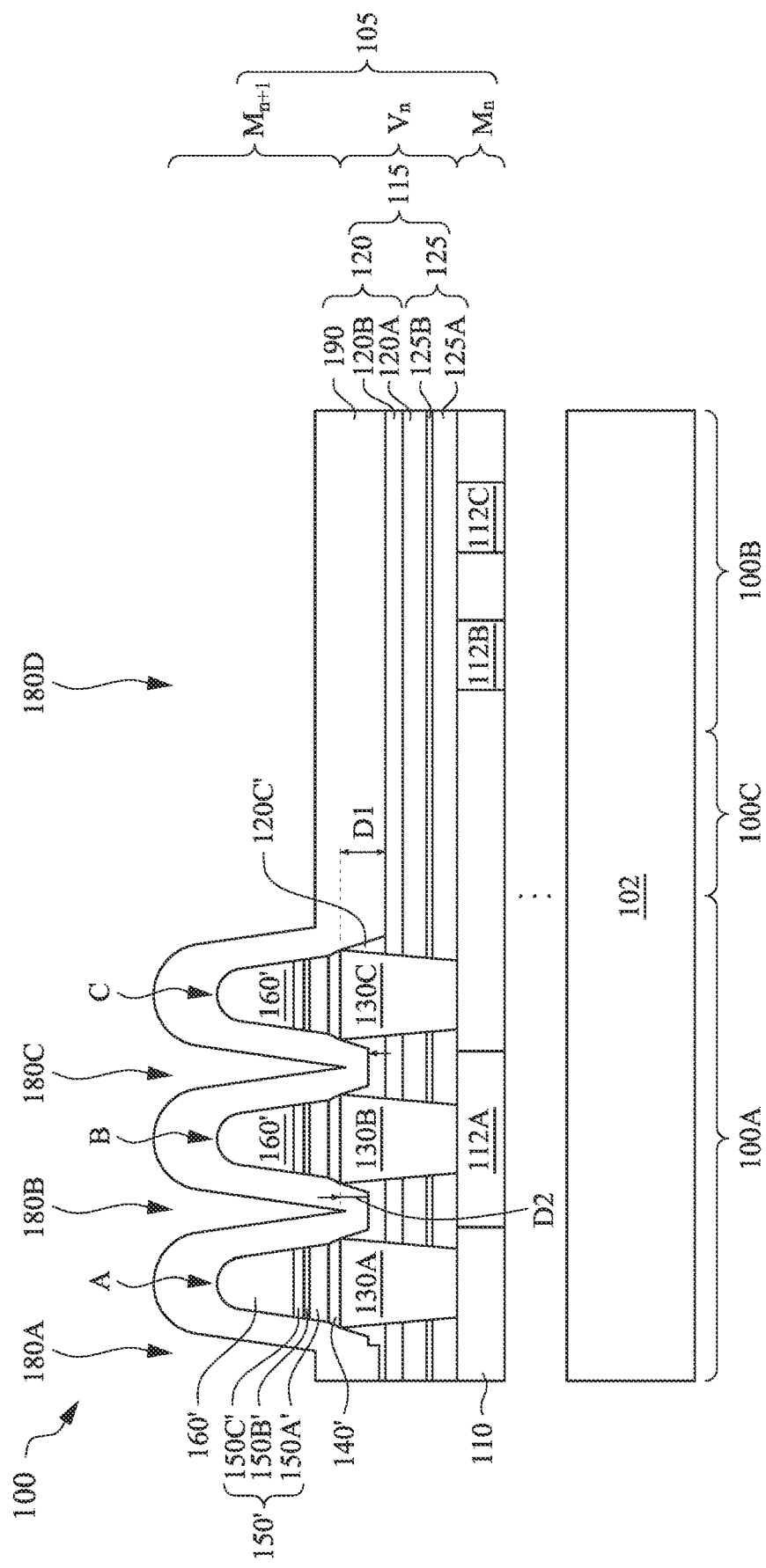

FIG. 6C illustrates another alternative embodiment of workpiece 100 after patterning MTJ layers 150 and bottom electrode layer 140. In this embodiment, IBE loading effects provide different depths of recesses in ILD layer 120 in memory region 100A (in particular, between MRAM cells A-C) and a memory cell region, such as intermediate region 100C. For example, because memory region 100A includes closely spaced memory structure patterns (e.g., MRAM cells A-C) while intermediate region 100C and/or logic region 100B are free of such memory structure patterns, openings 180A-180C are smaller than opening 180D, and IBE cannot remove portions of ILD layer 120 between MRAM cells A-C in memory region 100A as easily or as quickly as portions of ILD layer 120 in intermediate region 100C and/or logic region 100B. Accordingly, IBE over etch can remove dielectric layer 120C in memory region 100A, logic region 100B, and intermediate region 100C and reach dielectric layer 120B in intermediate region 100C and logic region 100B but not reach dielectric layer 120B in memory region 100A, in particular, before IBE stops upon reaching dielectric layer 120B in intermediate region 100C and/or logic region 100B. In such embodiments, openings 180A-180C do not extend through dielectric layer 120C, opening 180D extends through dielectric layer 120C to expose dielectric layer 120B, and recesses in ILD layer 120 in intermediate region 100C and/or logic region 100B have a depth D1 that is greater than a depth D2 of recesses in ILD layer 120 in memory region 100A. The embodiment of FIG. 6C thus provides ILD layer 120 with trapezoidal-shaped recesses between MRAM cells A-C that have sidewalls and bottoms formed by dielectric layer 120C. Further, because openings 180A-180C do not extend through dielectric layer 120C, dielectric layer 120A, dielectric layer 120B, and dielectric layer 120C extend continuously between adjacent bottom electrode vias 130A-130C. Though dielectric layer 120C has tapered portions proximate tops of bottom electrode vias 130A-130C in the embodiment of FIG. 6C, IBE does not provide spacers 120C' on sidewalls of bottom electrode vias 130A-130C that correspond with opening 180B and/or opening 180C between adjacent MRAM cells A-C. In some embodiments, spacers 120C' may form on sidewalls of bottom electrode vias 130A-130C at a memory cell edge region, such as on a sidewall of bottom electrode via 130C that is at a right edge of memory region 100A and adjacent to intermediate region 100C. Such sidewall corresponds with opening 180D. In some embodiments, after IBE, a thickness of dielectric layer 120C is less than thickness T3 in memory region 100A, a thickness of dielectric layer 120B is the same or less than thickness T2 in intermediate region 100C and/or logic region 100B, depth D1 is greater than thickness T3, and depth D2 is less than thickness T3.

Figure 6D:
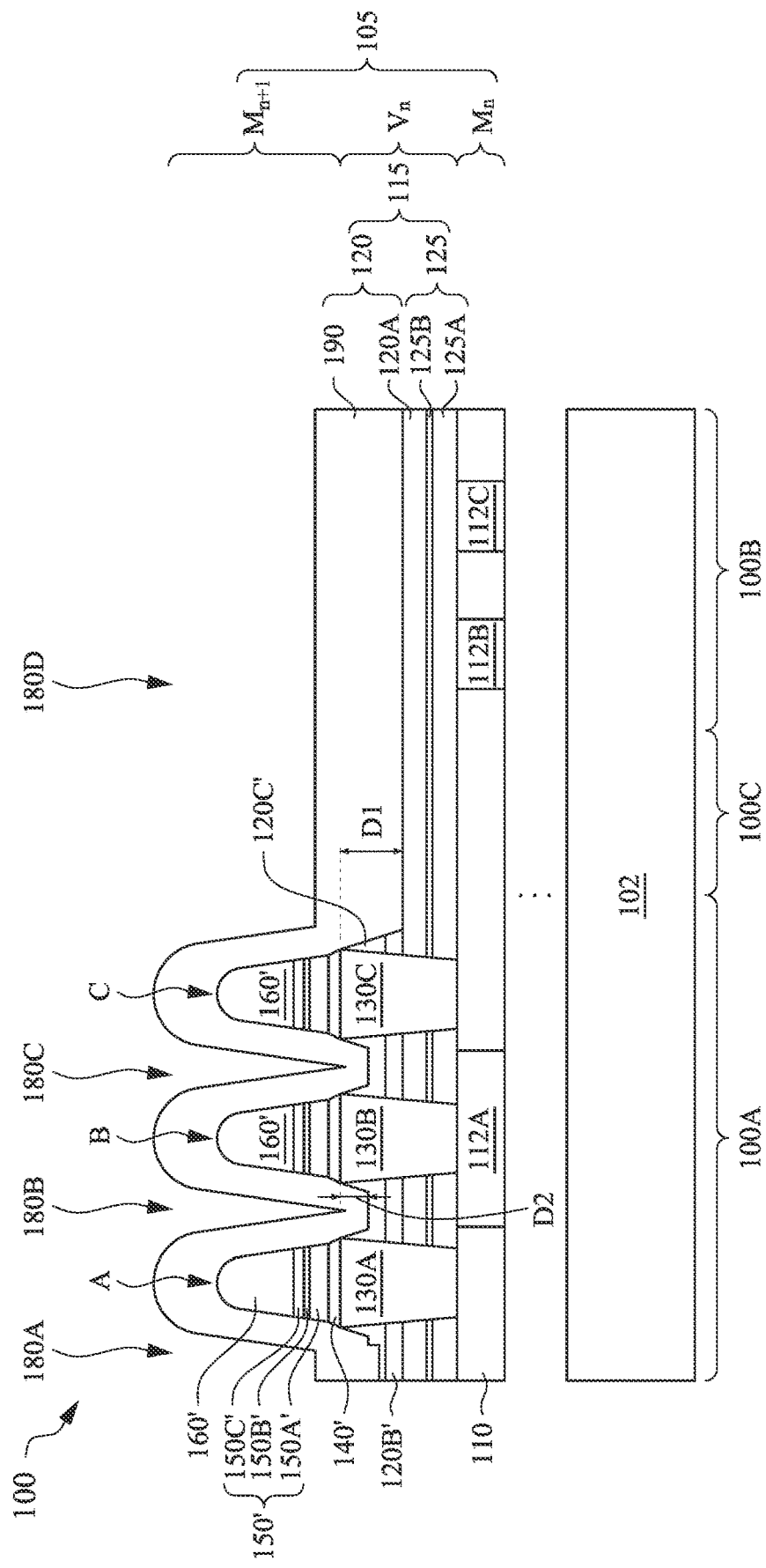
Figure 7A:
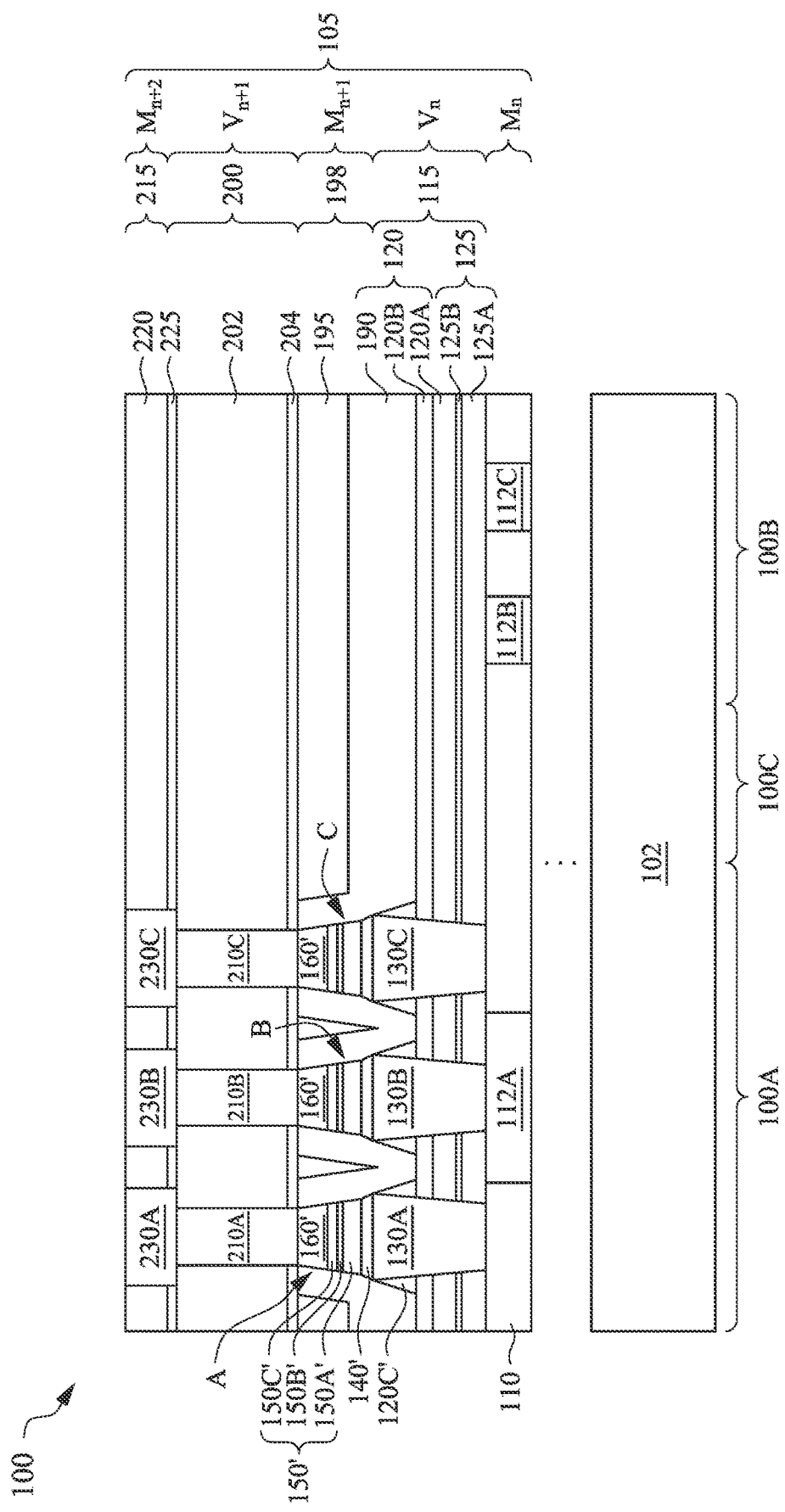
Figure 7B:
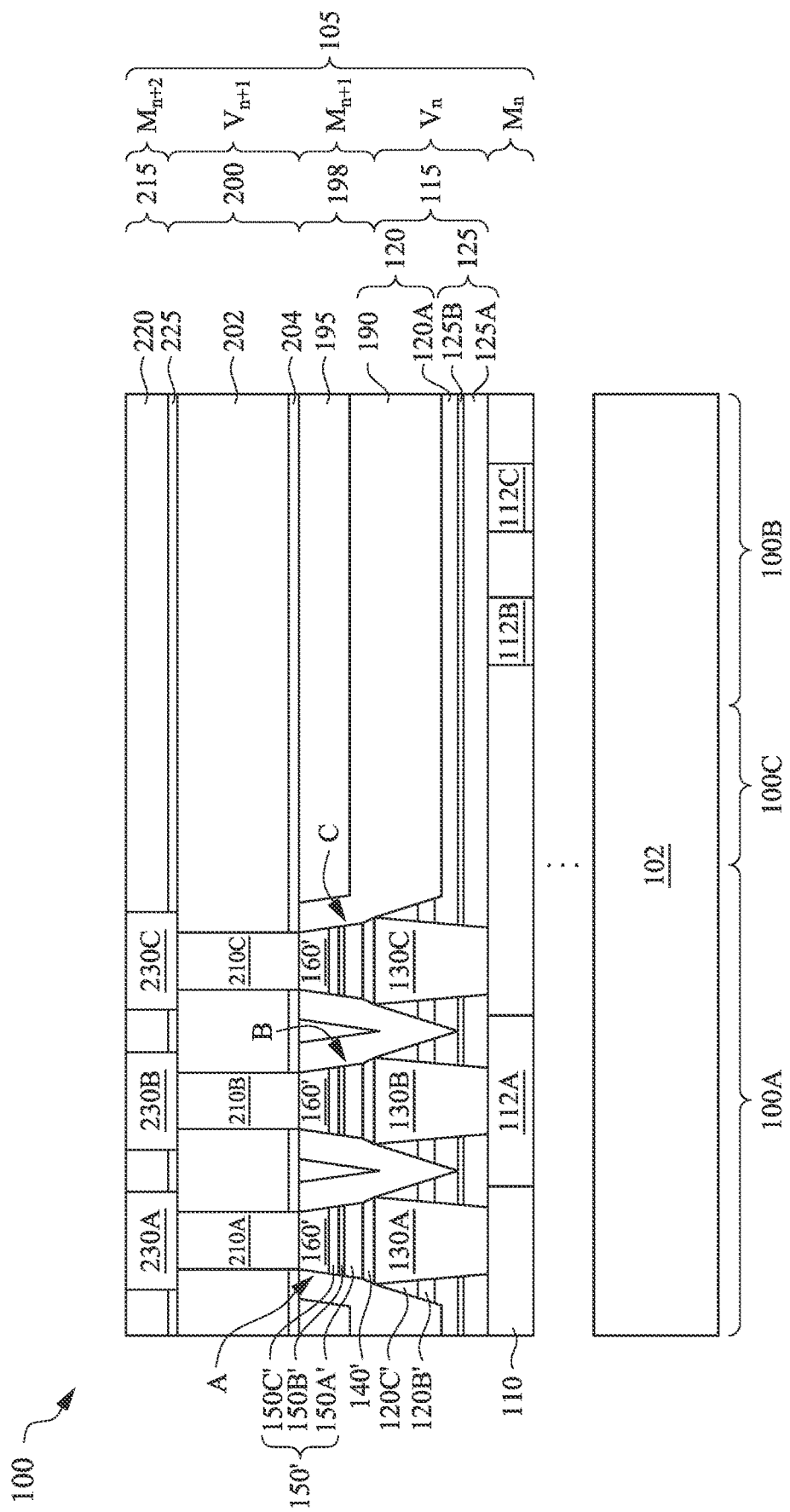
Figure 7C:
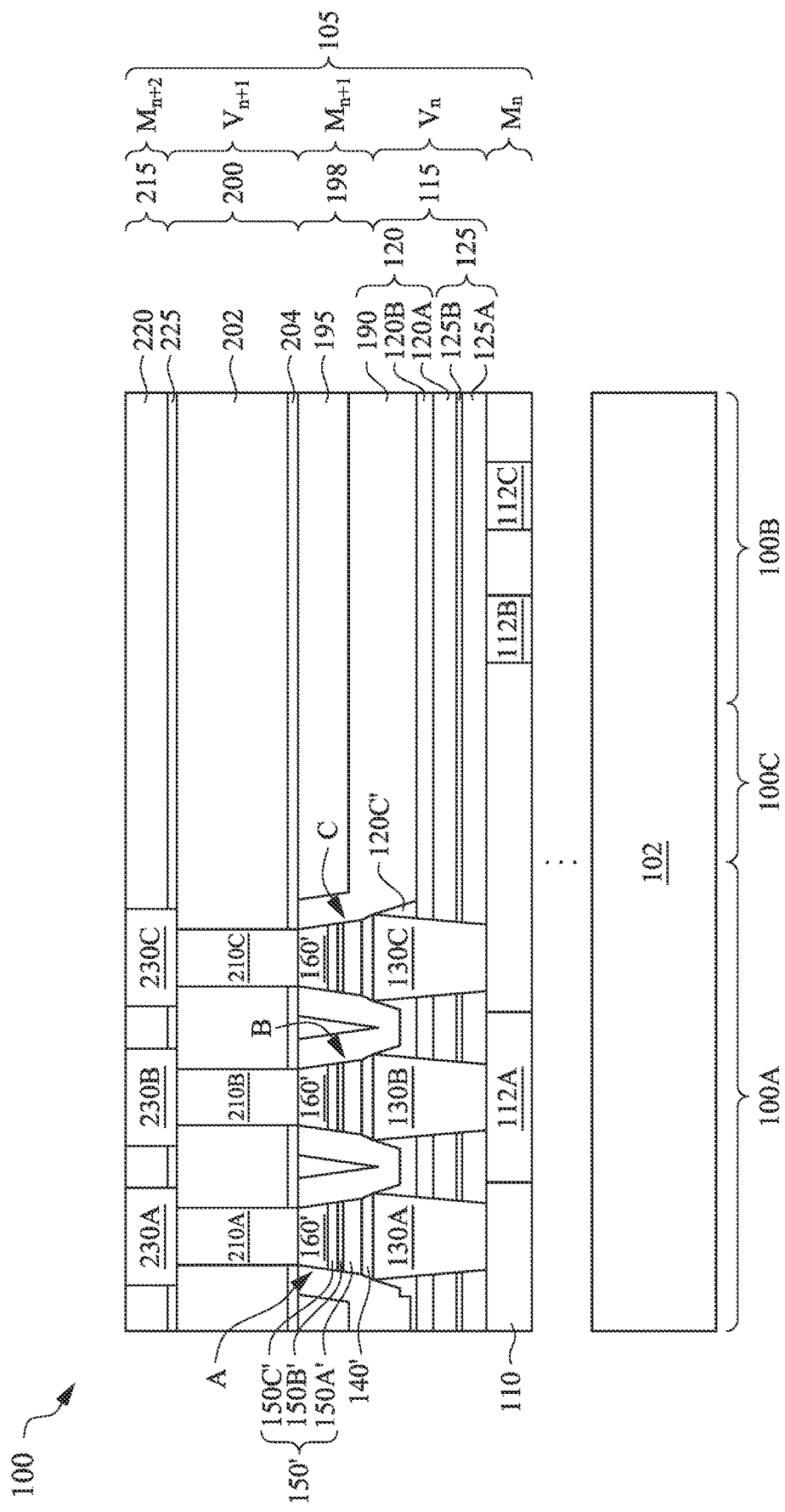
Figure 7D:
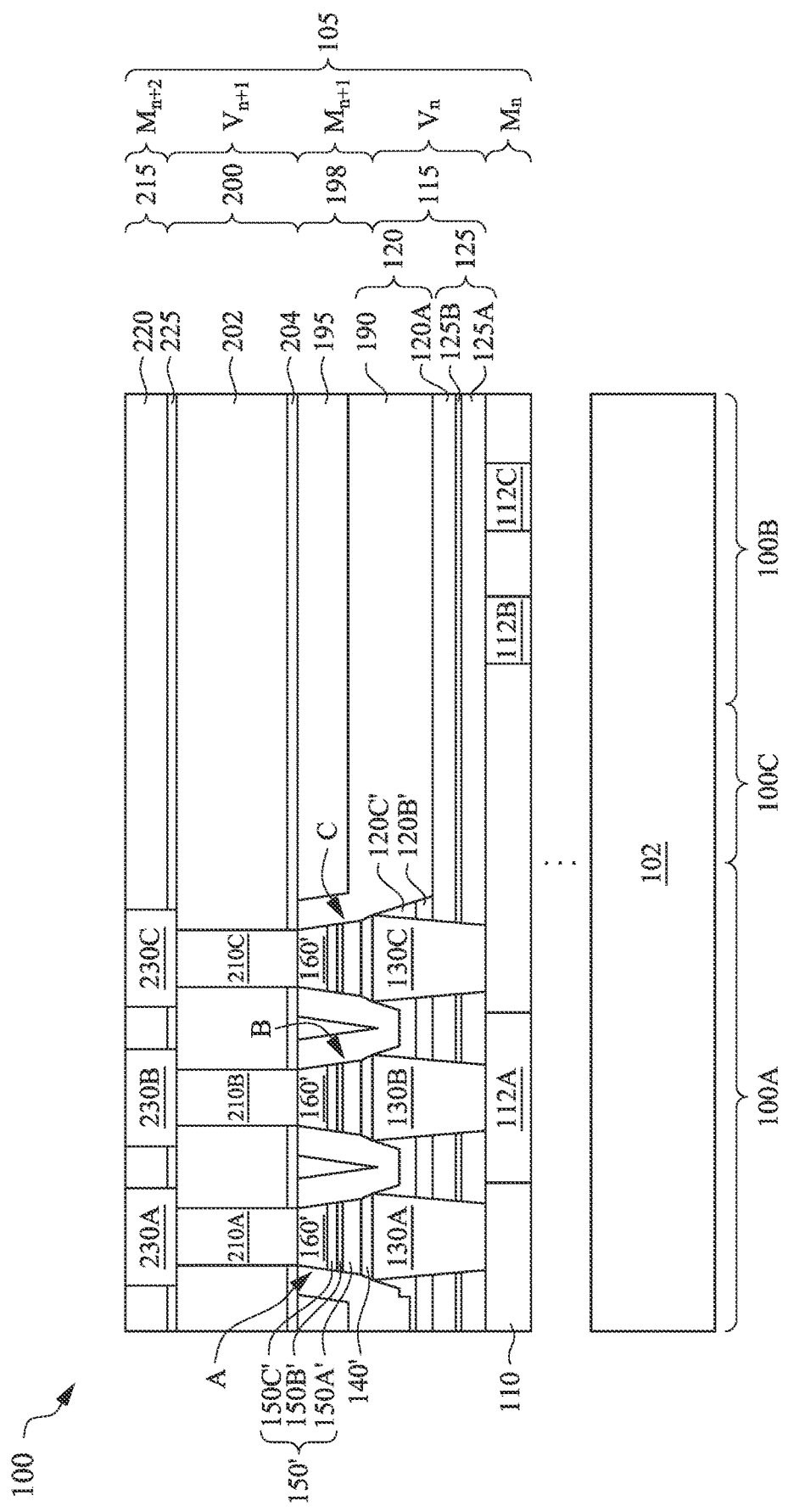
Figure 8B:
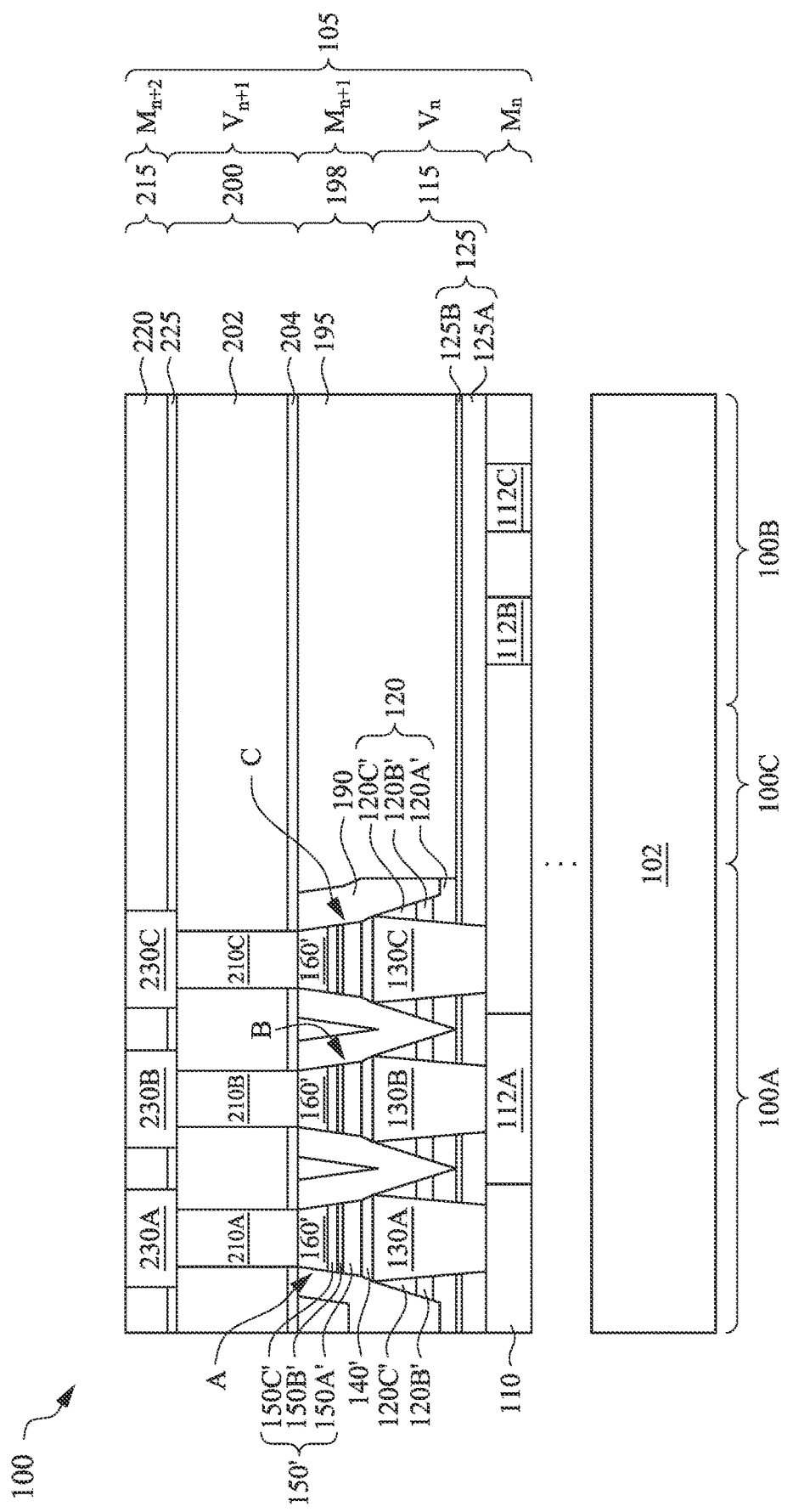
Figure 8C:
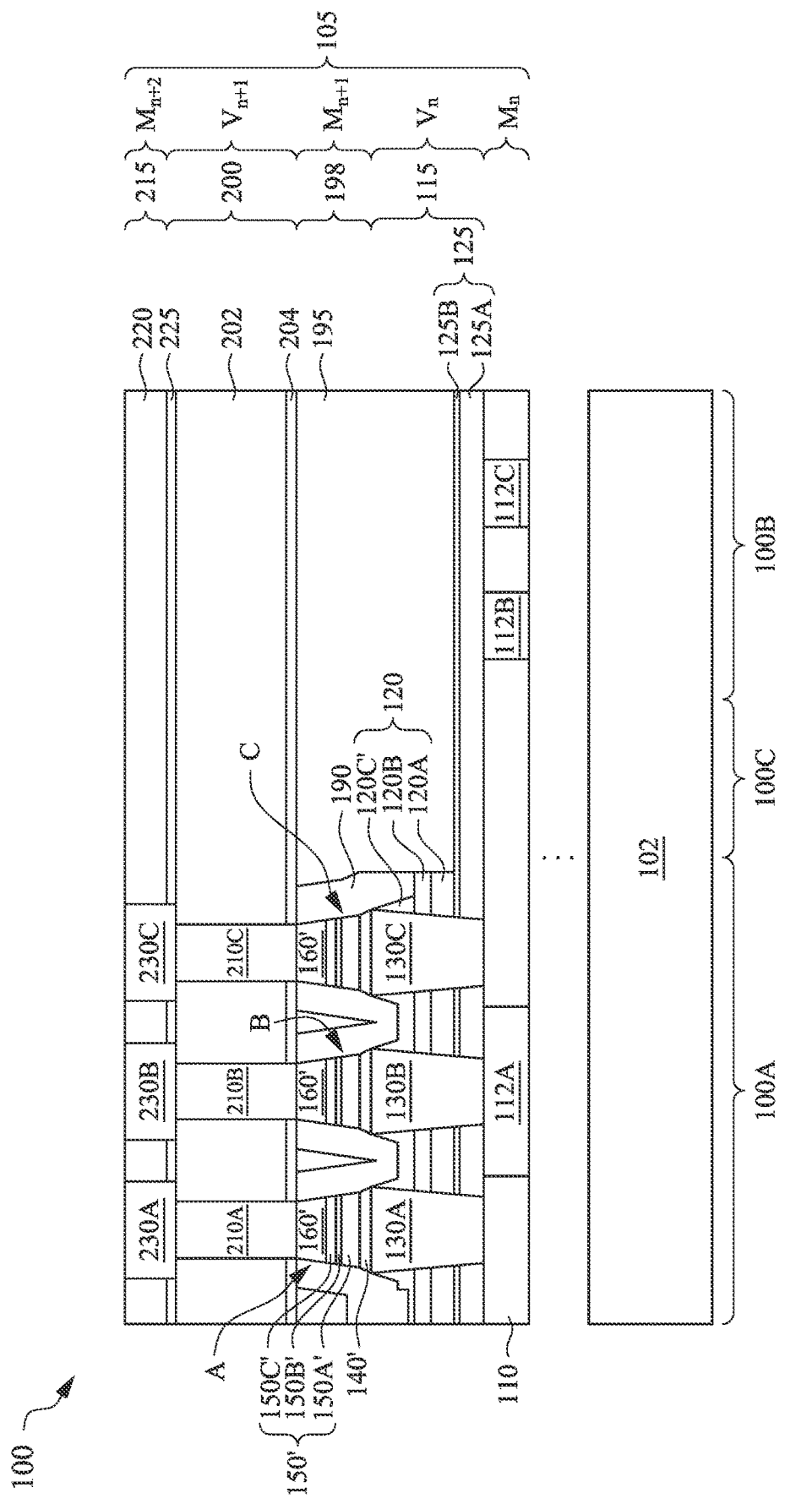
Figure 8D:
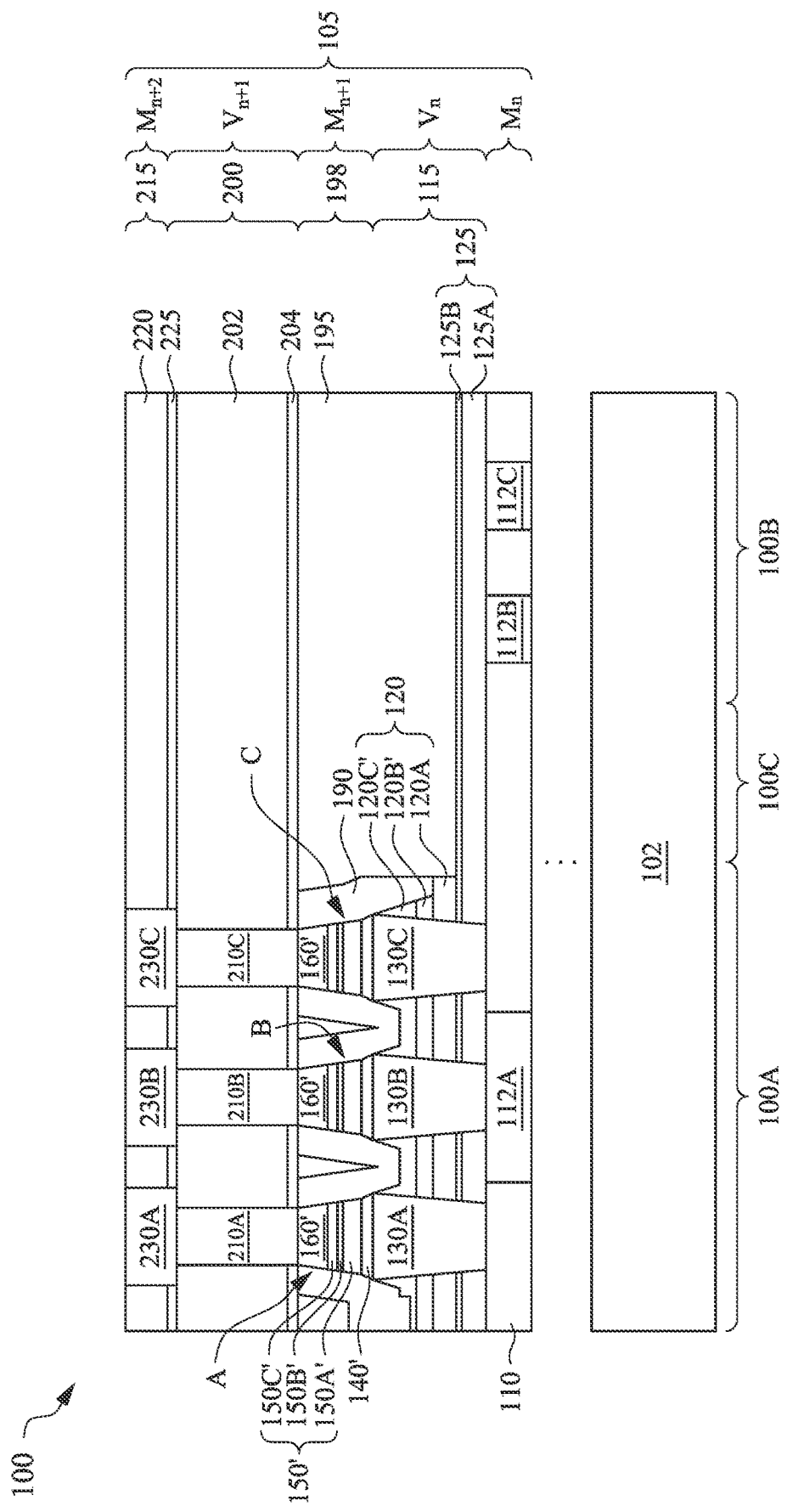

FIG. 6D illustrates yet another alternative embodiment of workpiece 100 after patterning MTJ layers 150 and bottom electrode layer 140. In this embodiment, similar to the embodiment of FIG. 6C, IBE loading effects provide different depths of recesses in ILD layer 120 in memory region 100A (in particular, between MRAM cells A-C) and a memory cell region, such as intermediate region 100C, and similar to the embodiment of FIG. 6B, IBE over etches dielectric layer 120B. In FIG. 6D, IBE over etch can remove dielectric layer 120C in memory region 100A, logic region 100B, and intermediate region 100C and reach and remove dielectric layer 120B in intermediate region 100C and logic region 100B but not reach dielectric layer 120B in memory region 100A. In such embodiments, openings 180A-180C do not extend through dielectric layer 120C, opening 180D extends through dielectric layer 120C and dielectric layer 120B to expose dielectric layer 120A, and recesses in ILD layer 120 in intermediate region 100C and/or logic region 100B have depth D1 greater than depth D2 of recesses in ILD layer 120 in memory region 100A. The embodiment of FIG. 6D also provides ILD layer 120 with trapezoidal-shaped recesses between MRAM cells A-C that have sidewalls and bottoms formed by dielectric layer 120C. Further, because openings 180A-180C do not extend through dielectric layer 120C, dielectric layer 120A, dielectric layer 120B, and dielectric layer 120C extend continuously between adjacent bottom electrode vias 130A-130C. Though dielectric layer 120C has tapered portions proximate tops of bottom electrode vias 130A-130C in the embodiment of FIG. 6D, IBE does not provide spacers 120C' or metal-containing dielectric spacers 120B' on sidewalls of bottom electrode vias 130A-130C that correspond with opening 180B and/or opening 180C between adjacent MRAM cells A-C. In some embodiments, spacers 120C' and/or metal-containing dielectric spacers 120B' may form on sidewalls of bottom electrode vias 130A-130C at a memory cell edge region, such as on a sidewall of bottom electrode via 130C that is at a right edge of memory region 100A and adjacent to intermediate region 100C. Such sidewall corresponds with opening 180D. In some embodiments, after IBE, a thickness of dielectric layer 120C is less than thickness T3 in memory region 100A, a thickness of dielectric layer 120A is the same or less than thickness T1 in intermediate region 100C and/or logic region 100B, depth D1 is greater than or equal to a sum of thickness T3 and thickness T2 but less than a total thickness of ILD layer 120, and depth D2 is less than thickness T3.

Returning to FIGS. 6A-6D, processing can further include forming a cap layer 190 over memory region 100A, logic region 100B, and intermediate region 100C of workpiece 100. Cap layer 190 conforms to workpiece 100, such that cap layer 190 wraps MRAM cells A-C and fills recesses formed in ILD layer 120 between MRAM cells A-C. In some embodiments, such as depicted, cap layer 190 fills spaces between bottom electrodes 140' of MRAM cells A-C. In some embodiments, cap layer 190 fills spaces between MTJ stacks 150' and/or top electrodes 160' of MRAM cells A-C. In some embodiments, a thickness of cap layer 190 is greater than a thickness T3 of dielectric layer 120C. Depending on IBE over etch of ILD layer 120, cap layer 190 physically contacts dielectric layer 120C, dielectric layer 120B, spacers 120C', and/or metal-containing dielectric spacers 120B. Cap layer 190 includes a dielectric material (and thus may alternatively be referred to as a dielectric layer), such as silicon oxide, silicon nitride, silicon oxynitride, silicon carbide, silicon carbonitride, aluminum oxide, magnesium oxide, other suitable dielectric material, or combinations thereof. Cap layer 190 is are deposited over workpiece 100 by CVD, PECVD, HDPCVD, FCVD, PVD, ALD, MOCVD, RPCVD, LPCVD, ALCVD, APCVD, other suitable deposition methods, or combinations thereof.

Turning to FIGS. 7A-7D, processing can continue with depositing an ILD layer 195 of $M_{n+1}$ metal layer over cap layer 190, where ILD layer 195 fills remainders of openings 180A-180D, and performing a planarization process that removes ILD layer 195 and cap layer 190 overlying top electrodes 160', thereby exposing top electrodes 160'. In some embodiments, the planarization process recesses top electrodes 160' and/or reduces a thickness of top electrodes 160'. In the depicted embodiment, the planarization process modifies a profile of top electrodes 160', for example, by flattening top surfaces of top electrodes 160' and providing trapezoidal-shaped top electrodes 160'. After the planarization process, top electrodes 160', cap layer 190, and ILD layer 195 may form a substantially planar, common surface. In some embodiments, ILD layer 195 and cap layer 190 combine to form a dielectric layer 198 of $M_{n+1}$ metal layer, where MRAM cells A-C are disposed in ILD layer 195 and form a portion of $M_{n+1}$ metal layer. ILD layer 195 and methods of fabrication thereof are similar to ILD layers and methods of fabrication thereof described herein. In some embodiments, ILD layer 195 has a multi-layer structure. In some embodiments, in logic region 110B, metal lines of $M_{n+1}$ metal layer are formed in dielectric layer 198, which may physically contact vias formed in dielectric layer 115 of $V_n$ via layer, which may physically contact metal lines of $M_n$ metal layer formed in dielectric layer 110, such as metal line 112A and metal line 112B, which may be physically and/or electrically connected to devices, such as a transistor, of device substrate 102.

In some embodiments, processing can continue with forming a $V_{n+1}$ via layer of MLI feature 105 over $M_{n+1}$ metal layer and forming an $M_{n+2}$ metal layer of MLI feature 105 over $V_{n+1}$ via layer. $V_{n+1}$ via layer includes $V_{n+1}$ vias disposed in a dielectric layer 200 (including, for example, an ILD layer 202 over a CESL 204), such as a top electrode via 210A, a top electrode via 210B, and a top electrode via 210C. Top electrode vias 210A-210C are formed in memory region 100A and extend through dielectric layer 200 to physically contact top electrodes 160' of MRAM cells A-C, respectively. $M_{n+2}$ metal layer includes $M_{n+2}$ metal lines disposed in a dielectric layer 215 (including, for example, an ILD layer 220 over a CESL 225), such as a metal line 230A, a metal line 230B, and a metal line 230C. Metal lines 230A-230C are formed in memory region 100A and extend through dielectric layer 215 to physically contact top electrode vias 210A-210C, respectively. ILD layer 202 and/or ILD layer 215 are similar to other ILD layers described herein and can be configured and/or fabricated as other ILD layers described herein. CESL 204 and/or CESL 225 are similar to other CESLs described herein and can be configured and/or fabricated as other CESLs described herein. Top electrode vias 210A-210C include a metal material, including for example, aluminum, copper, titanium, tantalum, tungsten, ruthenium, cobalt, iridium, palladium, platinum, nickel, alloys thereof, silicides thereof, other suitable metals, or combinations thereof. In some embodiments, top electrode vias 210A-210C are similar to bottom electrode vias 130A-130C and can be configured and/or fabricated as bottom electrode vias 130A-130C. Metal lines 230A-230C are similar to metal lines 112A-112C described herein and can be configured and/or fabricated as metal lines 112A-112C. In some embodiments, in logic region 110B, metal lines of $M_{n+2}$ metal layer are formed in dielectric layer 215, which may physically contact vias formed in dielectric layer 200 of $V_{n+1}$ via layer, which may physically contact metal lines of $M_{n+1}$ metal layer, and so forth.

FIGS. 8A-8D illustrate other embodiments of workpiece 100 after performing processing associated with FIGS. 7A-7D. In such embodiments, ILD layer 120 is removed from logic region 100B and/or intermediate region 100C before forming ILD layer 198. For example, processing can include forming a patterned mask layer over workpiece 100 that covers memory region 100A and exposes logic region 100B and/or intermediate region 100C and performing an etching process and/or other suitable process that removes cap layer 190 and remaining ILD layer 120 (e.g., dielectric layer 120B and/or dielectric layer 120C) in logic region 100B and/or intermediate region 100C, thereby exposing CESL 125. In some embodiments, the etching process also removes CESL 125B from logic region 100B and/or intermediate region 100C. In such embodiments, the etching process may stop at CESL 125A.

Figure 10:
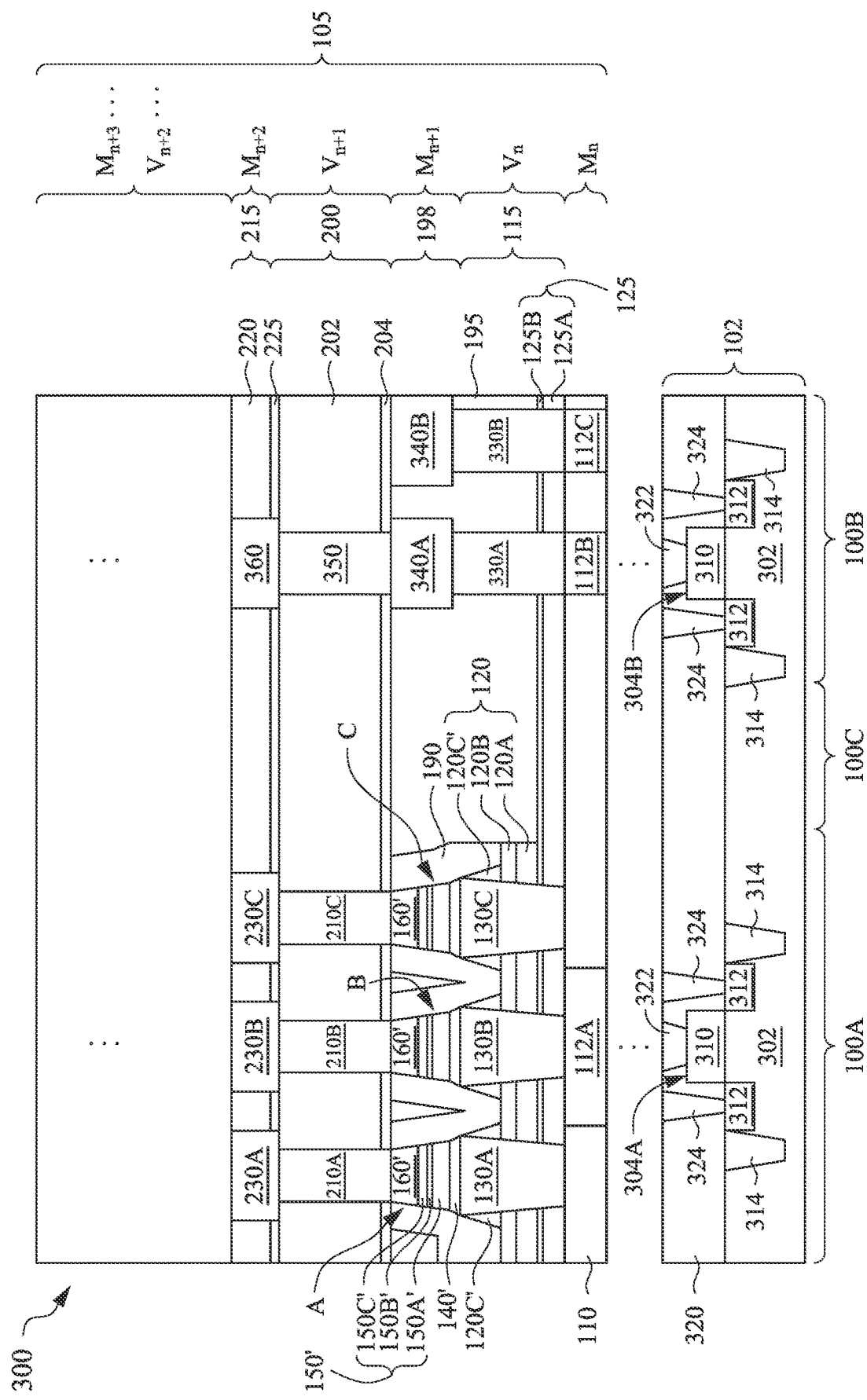
FIG. 10 is a fragmentary diagrammatic cross-sectional view of a device having a logic region and a memory region that includes an MRAM fabricated according to the method of FIG. 1 and/or methods associated with FIGS. 2-5, FIGS. 6A-6D, FIGS. 7A-7D, and FIGS. 8A-8D, in portion or entirety, according to various aspects of the present disclosure.

Turning to FIG. 10, FIG. 10 is a fragmentary diagrammatic cross-sectional view of a device 300 having a logic region and a memory region that includes an MRAM fabricated according to the method of FIG. 1 and/or methods associated with FIGS. 2-5, FIGS. 6A-6D, FIGS. 7A-7D, and FIGS. 8A-8D, in portion or entirety, according to various aspects of the present disclosure. Device 300 in FIG. 10 is similar in many respects to the device fabricated on workpiece in FIGS. 2-5, FIGS. 6A-6D, FIGS. 7A-7D, and FIGS. 8A-8D. Accordingly, for clarity and simplicity, similar features of device 300 in FIG. 10 and the device fabricated on workpiece 100 in FIGS. 2-5, FIGS. 6A-6D, FIGS. 7A-7D, and FIGS. 8A-8D are identified by the same reference numerals. For example, device 300 has memory region 100A, logic region 100B, and intermediate region 110C, each of which includes a portion of MLI feature 105 disposed over device substrate 102. In FIG. 10, device substrate 102 is depicted with a semiconductor substrate 302 and various transistors, such as a transistor 304A in memory region 100A and a transistor 304B in logic region 100B. Transistor 304A and transistor 304B each include a respective gate structure 310 (which can include gate spacers disposed along a gate stack (e.g., a gate electrode disposed over a gate dielectric)) disposed between respective source/drains 312 (e.g., epitaxial source/drains), which are disposed on, in, and/or over semiconductor substrate 302, where a channel extends between respective source/drains 312 in semiconductor substrate 302. Device substrate 102 may further include isolation structures 314, such as shallow trench isolation features, that separate and/or electrically isolate transistors, such as transistor 304A and transistor 304B, and/or other devices of device substrate 102 from one another. Device 300 further includes a dielectric layer 320, which is similar to and can be fabricated similar to the dielectric layers described herein (i.e., dielectric layer 320 can include one or more ILD layers and/or one or more CESLs), gate contacts 322 disposed in dielectric layer 320, and source/drain contacts 324 disposed in dielectric layer 320. Gate contacts 322 electrically and physically connect gate structures 310 (in particular, gate electrodes) to MLI feature 105, and source/drain contacts electrically and physically connect source/drain s312 to MLI feature 105. Gate contacts 322 and/or source/drain contacts 324 are configured and fabricated according to design requirements, and in some embodiments, are configured similar to and/or fabricated similar to interconnect structures described herein, such as metal lines 112A-112C, bottom electrode vias 130A-130C, vias 210A-210C, and/or metal lines 230A-230C. FIG. 10 has been simplified for the sake of clarity to better understand the inventive concepts of the present disclosure. Additional features can be added in device 300, and some of the features described below can be replaced, modified, or eliminated in other embodiments of device 300.

In some embodiments, transistor 304A is electrically connected to an MRAM cell, such as MRAM cell B, by MLI feature 105, a respective gate contact 322, and/or a respective source/drain contact 324. For example, bottom electrode 140' of MRAM cell B may be electrically connected to a source/drain of transistor 304A by bottom electrode via 130B, metal line 112A, interconnect structures in metallization layers between $M_n$ metal layer of MLI feature 105 and device substrate 102, and one of source/drain contacts 324. In some embodiments, the other source/drain contact 324 of transistor 304A may be electrically connected to a metal line in MLI feature 105 that is configured as a select line, gate structure 310 may be electrically connected to a metal line in MLI feature 105 that is configured as a word line (WL), and top electrode 160' may be electrically connected to a metal line in MLI feature 105 by via 210B and metal line 230B that is configured as a bit line (BL), where MTJ stack 150' of MRAM cell B is accessed (i.e., read from and/or written to) through the bit line, the word line, and/or the select line. In some embodiments, transistor 304B is electrically connected to MLI feature 105 by a respective gate contact 322 and/or respective source/drain contacts 324. For example, gate structure 310 may be electrically connected to metal line 112B by a respective gate contact 322 and interconnect structures in metallization layers between $M_n$ metal layer of MLI feature 105 and metal line 112B, and source/drains 312 may be electrically connected to metal lines in MLI feature 105 by a respective source/drain contacts 324 and interconnect structures in metallization layers between $M_n$ metal layer of MLI feature 105 and device substrate 102 and/or metal layers of MLI feature 105 above $M_n$ metal layer of MLI feature 105.

In the depicted embodiment, in logic region 100B, MLI feature 105 further includes a via 330A and a via 330B disposed in dielectric layer 115 (which includes ILD layer 195) of $V_n$ via layer; a metal line 340A and a metal line 340B disposed in ILD layer 198 (which includes ILD layer 195) of $M_{n+1}$ metal layer; a via 350 disposed in dielectric layer 200 of $V_{n+1}$ via layer; and a metal line 360 disposed in dielectric layer 215 of $M_{n+2}$ metal layer. Via 330A and via 330B are physically and electrically connected to metal line 112B and metal line 112B, respectively; metal line 340A and metal line 340B are physically and electrically connected to via 330A and via 330B, respectively; via 350 is physically and electrically connected to metal line 340A; and metal line 360 is physically and electrically connected to via 350. In some embodiments, such as depicted, MRAM cells A-C and metal lines 340A and metal lines 340A, 340B are a same metallization level of MLI feature 105.

The present disclosure provides for many different embodiments. An exemplary method includes forming a multilayer interlevel dielectric (ILD) layer having a metal-containing dielectric layer disposed between a first dielectric layer and a second dielectric layer, forming a bottom electrode via in the multilayer ILD layer, forming a bottom electrode layer over the second dielectric layer of the multilayer ILD layer and the bottom electrode via, forming magnetic tunnel junction (MTJ) layers over the bottom electrode layer, forming a top electrode layer over the MTJ layers, and etching the bottom electrode layer, the MTJ layers, and the top electrode layer to form a bottom electrode, an MTJ element, and a top electrode, respectively, of a memory. The etching forms a recess in the multilayer ILD layer that extends to the metal-containing dielectric layer of the multilayer ILD layer.

In some embodiments, the etching includes a first etch process that patterns the top electrode layer and a second etch process that patterns the MTJ layers and the bottom electrode layer. In such embodiments, the second etch process forms the recess. In some embodiments, the first etch process is a reactive ion etching (RIE) and the second etch process is an ion beam etching (IBE). In some embodiments, the etching forms metal-containing dielectric spacers along sidewalls of the bottom electrode of the memory. In some embodiments, the etching forms metal-containing dielectric spacers along sidewalls of the bottom electrode and the MTJ layers of the memory. In some embodiments, the metal-containing dielectric layer includes aluminum and oxygen, the first dielectric layer includes silicon and oxygen, and the second dielectric layer includes silicon and oxygen. In some embodiments, the etching stops at the metal-containing dielectric layer of the multilayer ILD layer. In some embodiments, the etching stops at the first dielectric layer of the multilayer ILD layer.

Another exemplary method includes depositing a first silicon oxide layer, depositing a metal oxide layer over the first silicon oxide layer, depositing a second silicon oxide layer over the metal oxide layer, forming a bottom electrode via that extends through the second silicon oxide layer, the metal oxide layer, and the first silicon oxide layer, and depositing and patterning a plurality of memory layers to form a first memory structure and a second memory structure. The patterning implements an ion beam etching process on at least one of the plurality of memory layers, and the ion beam etching process reaches the metal oxide layer. In some embodiments, the ion beam etching process is configured to etch the metal oxide layer and cause at least some of the etched metal oxide layer to re-deposit on sidewalls of the first memory structure and the second memory structure. In some embodiments, the etched metal oxide layer re-deposits on sidewalls of magnetic tunnel junction (MTJ) elements of the first memory structure and the second memory structure.

In some embodiments, the ion beam etching process stops at the metal oxide layer in a space between the first memory structure and the second memory structure and in an edge region adjacent the first memory structure and the second memory structure. In some embodiments, the ion beam etching process stops at the second silicon oxide layer in a space between the first memory structure and the second memory structure and at the metal oxide layer in an edge region adjacent the first memory structure and the second memory structure. In some embodiments, the ion beam etching process stops at the first silicon oxide layer in a space between the first memory structure and the second memory structure and in an edge region adjacent the first memory structure and the second memory structure. In some embodiments, the ion beam etching process stops at the second silicon oxide layer in a space between the first memory structure and the second memory structure and at the first silicon oxide layer in an edge region adjacent the first memory structure and the second memory structure. In some embodiments, no memory structure is disposed in the edge region.

An exemplary memory structure includes a bottom electrode via disposed in a multilayer interlevel dielectric (ILD) layer. The multilayer ILD layer has a metal-containing dielectric layer disposed between a first dielectric layer and a second dielectric layer. The memory structure further includes a memory element disposed over the bottom electrode via and the multilayer ILD layer. The memory element includes a magnetic tunneling junction (MTJ) stack disposed between a bottom electrode and a top electrode, and the bottom electrode physically contacts the bottom electrode via. The memory structure further includes a third dielectric layer disposed along sidewalls of the memory element and sidewalls of the first dielectric layer of the multilayer ILD layer. In some embodiments, the third dielectric layer physically contacts the metal-containing dielectric layer of the multilayer ILD layer. In some embodiments, the memory structure further includes metal-containing dielectric spacers between the third dielectric layer and the sidewalls of the memory element. In some embodiments, the metal-containing dielectric spacers have a nonuniform thickness. In some embodiments, the metal-containing dielectric layer is a metal oxide layer, the first dielectric layer is a silicon oxide layer, and the second dielectric layer is a silicon oxide layer.

In some embodiments, MRAM devices are provided in a memory device region (or MRAM region) of a semiconductor device and logic devices are provided in a logic device region (or logic region) of the semiconductor device. The memory device region may include an array of MRAM cells (or MRAM devices) arranged into rows and columns. MRAM cells in a same row may be connected to a common word line, and MRAM cells in a same column may be connected to a common bit line. MRAM array and/or MRAM cells of the MRAM array may be connected to logic devices of the logic region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a multilayer interlevel dielectric (ILD) layer having a metal-and-oxygen containing dielectric layer disposed between a first dielectric layer and a second dielectric layer;
    forming a bottom electrode via in the multilayer ILD layer, wherein the bottom electrode via extends through the first dielectric layer, the metal-and-oxygen containing dielectric layer, and the second dielectric layer to an underlying electrically conductive feature;
    forming a bottom electrode layer over the second dielectric layer of the multilayer ILD layer and the bottom electrode via, magnetic tunnel junction (MTJ) layers over the bottom electrode layer, and a top electrode layer over the MTJ layers; and
    etching the bottom electrode layer, the MTJ layers, and the top electrode layer to form a bottom electrode, an MTJ element, and a top electrode, respectively, of a memory, wherein the etching forms a recess in the multilayer ILD layer that extends to the metal-and-oxygen containing dielectric layer of the multilayer ILD layer; and
    etching of the metal-and-oxygen containing dielectric layer that causes metal-containing dielectric spacers to form along sidewalls of the bottom electrode of the memory.

2. The method of claim 1, wherein the etching includes a first etch process that patterns the top electrode layer and a second etch process that patterns the MTJ layers and the bottom electrode layer, wherein the second etch process forms the recess.

3. The method of claim 2, wherein the first etch process is a reactive ion etching (RIE) and the second etch process is an ion beam etching (IBE).

4. The method of claim 1, wherein the metal-containing dielectric spacers have tapered thicknesses.

5. The method of claim 1, further comprising etching of the metal-and-oxygen containing dielectric layer that causes metal-containing dielectric spacers to form along sidewalls of the MTJ layers of the memory.

6. The method of claim 1, wherein the metal-and-oxygen containing dielectric layer includes aluminum and oxygen, the first dielectric layer includes silicon and oxygen, and the second dielectric layer includes silicon and oxygen.

7. The method of claim 1, wherein the etching stops at the metal-and-oxygen containing dielectric layer of the multilayer ILD layer.

8. The method of claim 1, wherein the etching stops at the first dielectric layer of the multilayer ILD layer.

9. A method comprising:
depositing a first silicon oxide layer;
depositing a metal oxide layer over the first silicon oxide layer;
depositing a second silicon oxide layer over the metal oxide layer;
forming a bottom electrode via that extends through the second silicon oxide layer, the metal oxide layer, and the first silicon oxide layer; and
depositing and patterning a plurality of memory layers to form a first memory structure and a second memory structure, wherein the patterning implements an ion beam etching process on at least one of the plurality of memory layers, wherein the ion beam etching process reaches the metal oxide layer.

10. The method of claim 9, wherein the ion beam etching process is configured to etch the metal oxide layer and cause at least some of the etched metal oxide layer to re-deposit on sidewalls of the first memory structure and the second memory structure.

11. The method of claim 10, wherein the etched metal oxide layer re-deposits on sidewalls of magnetic tunnel junction (MTJ) elements of the first memory structure and the second memory structure.

12. The method of claim 9, wherein the ion beam etching process stops at the metal oxide layer in a space between the first memory structure and the second memory structure and in an edge region adjacent the first memory structure and the second memory structure, wherein no memory structure is disposed in the edge region.

13. The method of claim 9, wherein the ion beam etching process stops at the second silicon oxide layer in a space between the first memory structure and the second memory structure and at the metal oxide layer in an edge region adjacent the first memory structure and the second memory structure, wherein no memory structure is disposed in the edge region.

14. The method of claim 9, wherein the ion beam etching process stops at the first silicon oxide layer in a space between the first memory structure and the second memory structure and in an edge region adjacent the first memory structure and the second memory structure, wherein no memory structure is disposed in the edge region.

15. The method of claim 9, wherein the ion beam etching process stops at the second silicon oxide layer in a space between the first memory structure and the second memory structure and at the first silicon oxide layer in an edge region adjacent the first memory structure and the second memory structure, wherein no memory structure is disposed in the edge region.

16. A method comprising:
forming a bottom electrode via in a multilayer interlevel dielectric (ILD) layer having a metal-containing dielectric layer disposed between a first dielectric layer and a second dielectric layer;
forming a bottom electrode layer over the second dielectric layer of the multilayer ILD layer and the bottom electrode via, magnetic tunnel junction (MTJ) layers over the bottom electrode layer, and a top electrode layer over the MTJ layers;
patterning the top electrode layer with a first etching process;
patterning the MTJ layers and the bottom electrode layer with a second etching process that is different than the first etching process, wherein the patterning the MTJ layers and the bottom electrode layer with the second etching process includes partially removing the MTJ layers and the bottom electrode layer from a first region and completely removing the MTJ layers and the bottom electrode layer from a second region; and
patterning the second dielectric layer with the second etching process and exposing the metal-containing dielectric layer, wherein the patterning the second dielectric layer with the second etching process includes partially removing the second dielectric layer from the first region and completely removing the second dielectric layer from the second region.

17. The method of claim 16, wherein the first etching process is a reactive ion etching process and the second etching process is an ion beam etching process.

18. The method of claim 16, wherein an etch rate of the second dielectric layer to the second etching process is greater than an etch rate of the metal-containing dielectric layer to the second etching process.

19. The method of claim 18, wherein a ratio of the etch rate of the second dielectric layer to the second etching process to the etch rate of the metal-containing dielectric layer to the second etching process is about 2:1 to about 4:1.

20. The method of claim 16, wherein:
the metal-containing dielectric layer is an aluminum oxide layer; and
the first dielectric layer and the second dielectric layer are silicon oxide layers.

* * * * *